(12) United States Patent
Ito

(10) Patent No.: US 7,205,783 B2
(45) Date of Patent: Apr. 17, 2007

(54) SEMICONDUCTOR INTEGRATED CIRCUIT, AND ELECTROSTATIC WITHSTAND VOLTAGE TEST METHOD AND APPARATUS THEREFOR

(75) Inventor: Minoru Ito, Shiga (JP)

(73) Assignee: Matsushita Electric Industrial Co., Ltd., Kadoma-shi, Osaka (JP)

( * ) Notice: Subject to any disclaimer, the term of this patent is extended or adjusted under 35 U.S.C. 154(b) by 42 days.

(21) Appl. No.: 10/875,624

(22) Filed: Jun. 25, 2004

(65) Prior Publication Data

US 2005/0017745 A1     Jan. 27, 2005

(30) Foreign Application Priority Data

Jul. 8, 2003   (JP)   ............................. 2003-272094

(51) Int. Cl.
*G01R 31/00* (2006.01)
(52) U.S. Cl. .................................. 324/765; 324/158.1
(58) Field of Classification Search ............... 324/456, 324/158.1, 73.1, 763–765, 72, 452; 714/724, 714/733, 734; 361/56, 225, 111
See application file for complete search history.

(56) References Cited

U.S. PATENT DOCUMENTS

| 4,823,088 A | * | 4/1989 | Fukuda ....................... 324/456 |
| 5,132,612 A | | 7/1992 | Burns et al. |
| 5,376,879 A | * | 12/1994 | Schrimpf et al. ............. 324/72 |
| 5,410,254 A | * | 4/1995 | Consiglio .................... 324/456 |
| 2005/0030043 A1 | * | 2/2005 | Ker et al. .................... 324/456 |

FOREIGN PATENT DOCUMENTS

| JP | 63-295981 | 12/1988 |
| JP | 10-123212 | 5/1998 |
| JP | 2000-111596 | 4/2000 |
| JP | 2001-091572 | 4/2001 |

* cited by examiner

*Primary Examiner*—Vinh P. Nguyen
(74) *Attorney, Agent, or Firm*—The Nath Law Group; Jerald L. Meyer; Matthew J. Moffa

(57) ABSTRACT

An electrostatic withstand voltage test method that enables semiconductor integrated circuit testing to be performed with a high degree of precision and at low cost. In this method, with one of ground pins VSS and VSSI of a semiconductor integrated circuit 100 grounded, static electricity is applied from a static electricity discharge apparatus 102 to all pins of semiconductor integrated circuit 100, after which, with power supply apparatus 106 connected to power supply pin VDD of semiconductor integrated circuit 100 and the other grounded, a leakage current test apparatus 116 is connected to all signal pins and pin leakage current is tested, and with ground pin VSSI of the internal circuitry of semiconductor integrated circuit 100 grounded and leakage current test apparatus 104 connected to power supply pin VDDI, a pattern generator 105 that supplies a digital signal is connected to signal input pins (IN, I/O), and power supply leakage current is tested.

4 Claims, 17 Drawing Sheets

SEMICONDUCTOR INTEGRATED CIRCUIT, AND ELECTROSTATIC WITHSTAND VOLTAGE TEST METHOD AND APPARATUS THEREFOR

BACKGROUND OF THE INVENTION

1. Field of the Invention

The present invention relates to an electrostatic withstand voltage test method and apparatus that apply static electricity to a semiconductor integrated circuit and test for the occurrence of electrical breakdown.

2. Description of Related Art

As an electrostatic withstand voltage test method, the method disclosed in Unexamined Japanese Patent Publication No.2000-111596 (0015 through 0025, FIG. 1) is known, for example. An outline description of this method will be given below with reference to FIG. 1. FIG. 1 is a block diagram showing an exemplary configuration of a conventional electrostatic withstand voltage test apparatus 10.

In the aforementioned document, an electrostatic test apparatus is disclosed that, as shown in FIG. 1, is provided with a part holding section 12 holding an electrical part comprising a predetermined electrical circuit (product under test) 11, a discharge section (discharge gun) 13 that is located opposite this electrical part (product under test) 11 held in part holding section 12 and that is discharged by applying a high voltage, and a testing section 14 that tests whether or not the electrical circuitry of electrical part (product under test) 11 after a discharge is normal, and is configured so that a test of whether or not the electrical circuitry of electrical part (product under test) 11 after a discharge is normal is performed by testing section 14 after static electricity from discharge section (discharge gun) 13 is applied to electrical part (product under test) 11 while electrical part (product under test) 11 is held in part holding section 12; and wherein a power supply (direct current power supply) 15 that supplies electric power to electrical part (product under test) 11 held in part holding section 12 is provided upstream of part holding section 12, a power supply side switch member 16 is located between this power supply (direct current power supply) 15 and electrical part (product under test) 11, and a testing section side switch member 17 is located between testing section 14 and electrical part (product under test) 11, and a control section 18 is provided that controls driving of discharge section (discharge gun) 13 and testing by testing section 14.

Also, a conventional technique relating to a contactless pin leakage current test enabled input/output circuit is shown in Unexamined Japanese Patent Publication No. HEI 10-123212 (FIG. 1).

However, with the electrostatic withstand voltage test method disclosed in Unexamined Japanese Patent Publication No. 2000-111596, whether or not an electrical circuit is normal is determined by testing the operating state of a semiconductor integrated circuit after discharge of static electricity, but since there may be cases where electrostatic breakdown of some kind has occurred even though operation is normal, it is not possible to detect the occurrence of such minor electrostatic breakdown with this disclosed method. As the occurrence of minor electrostatic breakdown appears in the form of leakage current, it leads to increased current dissipation and can be a cause of heat generation. Thus, it is not possible to conduct semiconductor integrated circuit testing adequately with the electrostatic withstand voltage test method disclosed in Unexamined Japanese Patent Publication No.2000-111596.

SUMMARY OF THE INVENTION

It is an object of the present invention to provide an electrostatic withstand voltage test method and apparatus that enable semiconductor integrated circuit testing to be performed with a high degree of precision and at low cost.

According to an aspect of the invention, in a semiconductor integrated circuit electrostatic withstand voltage test method, while a power supply pin or ground pin of a semiconductor integrated circuit is grounded, static electricity is applied to desired pins of that semiconductor integrated circuit, after which, while power is supplied to either the power supply pin or ground pin of the semiconductor integrated circuit and the other is grounded, pin leakage current is tested for all signal pins; and also, while either power supply pins or ground pins of both an internal circuitry and input/output circuit of the semiconductor integrated circuit are grounded, and power is supplied to the other of the power supply pin or ground pin of the input/output circuit and digital signals are supplied to signal input pins, power supply leakage current is tested using the other of the power supply pin or ground pin of the internal circuitry.

According to another aspect of the invention, in a semiconductor integrated circuit electrostatic withstand voltage test method, while a power supply pin or ground pin of that semiconductor integrated circuit is grounded and a dedicated leakage current test pin is provided with a semiconductor integrated circuit, static electricity is applied to desired pins of the semiconductor integrated circuit, after which, while either power supply pins or ground pins of both an internal circuitry and input/output circuit of the semiconductor integrated circuit are grounded, and power is supplied to the other of the power supply pin or ground pin of the input/output circuit, a digital signal is supplied to the dedicated leakage current test pin, the input/output circuit is set to high-impedance mode and pin leakage current is tested, an input signal connected to the internal circuitry is controlled to a low level or a high level, and power supply leakage current is tested using the other of the power supply pin or ground pin of the internal circuitry.

According to still another aspect of the invention, in a semiconductor integrated circuit electrostatic withstand voltage test method, in a semiconductor integrated circuit one or more flip-flops are provided, a dedicated leakage current test flip-flop chain is formed by linking a plurality of contactless pin leakage current test enabled input/output circuits incorporating a dedicated circuit that enables pin leakage current testing under non-contact with outside, and while a power supply pin or ground pin of that semiconductor integrated circuit is grounded, static electricity is applied to desired pins of the semiconductor integrated circuit, after which, while either power supply pins or ground pins of both an internal circuitry and input/output circuit of the semiconductor integrated circuit are grounded, and power is supplied to the other of the power supply pin or ground pin of the input/output circuit, digital signals are supplied to dedicated leakage current test pins provided to the input/output circuit, pin leakage current of the input/output circuit is tested by testing the logic of a digital signal output from the dedicated leakage current test pin, input signals connected to the internal circuitry are controlled to a low level or a high level, and power supply leakage current is tested using the other of the power supply pin or ground pin of the internal circuitry.

According to a further aspect of the invention, a semiconductor integrated circuit electrostatic withstand voltage test apparatus comprises a static electricity discharge section that, while a power supply pin or ground pin of a semiconductor integrated circuit is grounded, applies static electricity to desired pins of that semiconductor integrated circuit; a first leakage current testing section that, while power is supplied to either the power supply pin or ground pin of the semiconductor integrated circuit and the other is grounded, tests pin leakage current of all signal pins; and a second leakage current testing section that, while either power supply pins or ground pins of both an internal circuitry and input/output circuit of the semiconductor integrated circuit are grounded, and power is supplied to the other of the power supply pin or ground pin of the input/output circuit and digital signals are supplied to signal input pin, tests power supply leakage current using the other of the power supply pin or ground pin of the internal circuitry.

According to a still further aspect of the invention, a semiconductor integrated circuit electrostatic withstand voltage test apparatus comprises an input/output circuit of a semiconductor integrated circuit that is provided with one or more flip-flops for forming a dedicated leakage current test flip-flop chain and incorporating a dedicated circuit that enables pin leakage current testing under non-contact with outside; a static electricity discharge section that, while a power supply pin or ground pin of that semiconductor integrated circuit is grounded applies static electricity to desired pins of the semiconductor integrated circuit; a testing section that, while either power supply pins or ground pins of both an internal circuitry and input/output circuit of the semiconductor integrated circuit are grounded, and power is supplied to the other of the power supply pin or ground pin of the input/output circuit, supplies digital signals to dedicated leakage current test pins provided to the input/output circuit, and tests pin leakage current by testing the logic of a digital signal output from the dedicated leakage current test pin; and a leakage current testing section that supplies digital signals to the dedicated leakage current test pins and tests power supply leakage current using the other of the power supply pin or ground pin of the internal circuitry.

According to a yet further aspect of the invention, in a semiconductor integrated circuit, while a power supply pin or ground pin of a semiconductor integrated circuit is grounded, static electricity is applied to desired pins of that semiconductor integrated circuit, after which, while either power supply pins or ground pins of both an internal circuitry and input/output circuit of the semiconductor integrated circuit are grounded, and power is supplied to the other of the power supply pin or ground pin of the input/output circuit, digital signals are supplied to a dedicated leakage current test pins provided to the input/output circuit, and one or more flip-flops are provided for testing pin leakage current of the input/output circuit by testing the logic of a digital signal output from the dedicated leakage current test pin, controlling input signals connected to the internal circuitry to a low level or a high level, and testing power supply leakage current using the other of the power supply pin or ground pin of the internal circuitry, a dedicated leakage current test flip-flop chain is formed by linking a plurality of contactless pin leakage current test enabled input/output circuits incorporating a dedicated circuit that enables pin leakage current testing under non-contact with outside, and in the internal circuitry, data inputs of one or more scan path flip-flop chains are connected to an arbitrary place in the dedicated leakage current test flip-flop chain via a selector, or a plurality of dedicated leakage current test flip-flop chains are connected as one via a selector and the earliest data input of the first flip-flop chains is connected to an arbitrary place in the dedicated leakage current test flip-flop chain via a selector, digital signals are supplied to the dedicated leakage current test pins, the state of the internal circuitry is set, and an internal circuitry power supply leakage test is carried out.

BRIEF DESCRIPTION OF THE DRAWINGS

The above and other objects and features of the invention will appear more fully hereinafter from a consideration of the following description taken in conjunction with the accompanying drawing wherein examples are illustrated by way of example, in which.

DESCRIPTION OF THE PREFERRED EMBODIMENTS

With reference now to the accompanying drawings, embodiments of the present invention will be explained in detail below.

(Embodiment 1)

Figure 3:
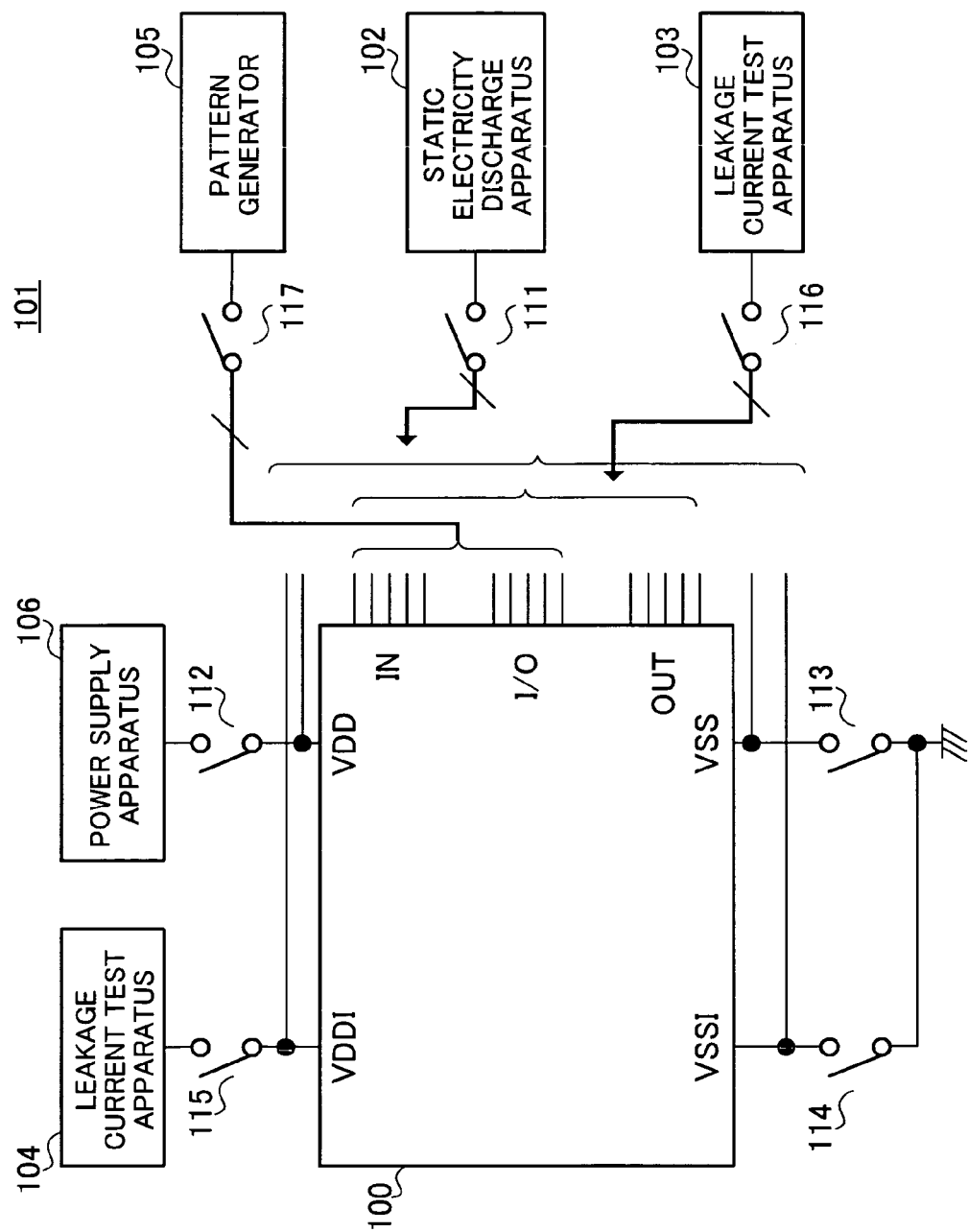
FIG. 3 is a block diagram showing the configuration of an apparatus that implements an electrostatic withstand voltage test method according to Embodiment 1 of the present invention.

FIG. 3 is a block diagram showing the configuration of an apparatus that implements an electrostatic withstand voltage test method according to Embodiment 1 of the present invention. In FIG. 3, a semiconductor integrated circuit (hereinafter referred to as "IC") 100 to be tested is provided with input pins IN, input/output pins I/O, output pins OUT, IC input cell, output cell, and input/output cell power supply pin VDD and ground pin VSS, and internal circuitry power supply pin VDDI and ground pin VSSI.

Electrostatic withstand voltage test apparatus 101 comprises a static electricity discharge apparatus 102, leakage current test apparatuses 103 and 104, and a pattern generator 105. Static electricity discharge apparatus 102 is connected to all the above-mentioned pins via a plurality of switches 111. Power supply pin VDD is connected to a power supply apparatus 106 via a switch 112. Ground pin VSS and ground pin VSSI are grounded (connected to ground) via a switch 113 and a switch 114 respectively.

Leakage current test apparatus 104 is connected to power supply pin VDDI via a switch 115. Leakage current test apparatus 103, on the other hand, is connected to input pins IN, input/output pins I/O, and output pins OUT via a plurality of switches 116. Pattern generator 105 is connected to input pins IN, and input/output pins I/O in input mode, via a plurality of switches 117.

With the above configuration, an electrostatic withstand voltage test of IC 100 is conducted using the following procedure. First, with one of switch 113 and switch 114 closed and one of ground pins VSS and VSSI grounded, or with the other of switch 113 and switch 114 closed and the other of ground pins VSS and VSSI grounded, static electricity of an arbitrary voltage is applied from static electricity discharge apparatus 102 to all pins or desired pins of IC 100 by sequentially closing switches 111.

Next, with switch 112 closed and power supply pin VDD connected to power supply apparatus 106, and switch 113 and switch 114 closed and ground pins VSS and VSSI grounded, plurality of switches 116 are closed sequentially. By this means, it is possible to test for the presence or absence of leakage current for all input pins IN, output pins OUT, and input/output pins I/O with leakage current test apparatus 103.

Also, switch 112 is closed and power supply pin VDD is connected to power supply apparatus 106, switch 113 is closed and ground pin VSS is grounded, and switch 114 is closed and ground pin VSSI is grounded. In addition, switch 115 is closed and power supply pin VDDI is connected to leakage current test apparatus 104. In this state, plurality of switches 117 are closed, digital signals are applied from pattern generator 105 to input pins IN and to input/output pins I/O which is set to its input mode, and the internal circuitry is set to an arbitrary state. By this means, it is possible to test for the presence or absence of a power supply leakage current of the internal circuitry with leakage current test apparatus 104.

As static electricity can be applied and pin leakage current testing and power supply leakage current testing can be performed in this way, test precision can be increased. Also, as static electricity application and leakage current testing can be performed consecutively, major rationalization of electrostatic withstand voltage testing can be achieved. However, the precision of pin leakage current testing may be low for some output pins OUT and some output mode input/output pins I/O.

(Embodiment 2)

Figure 4:
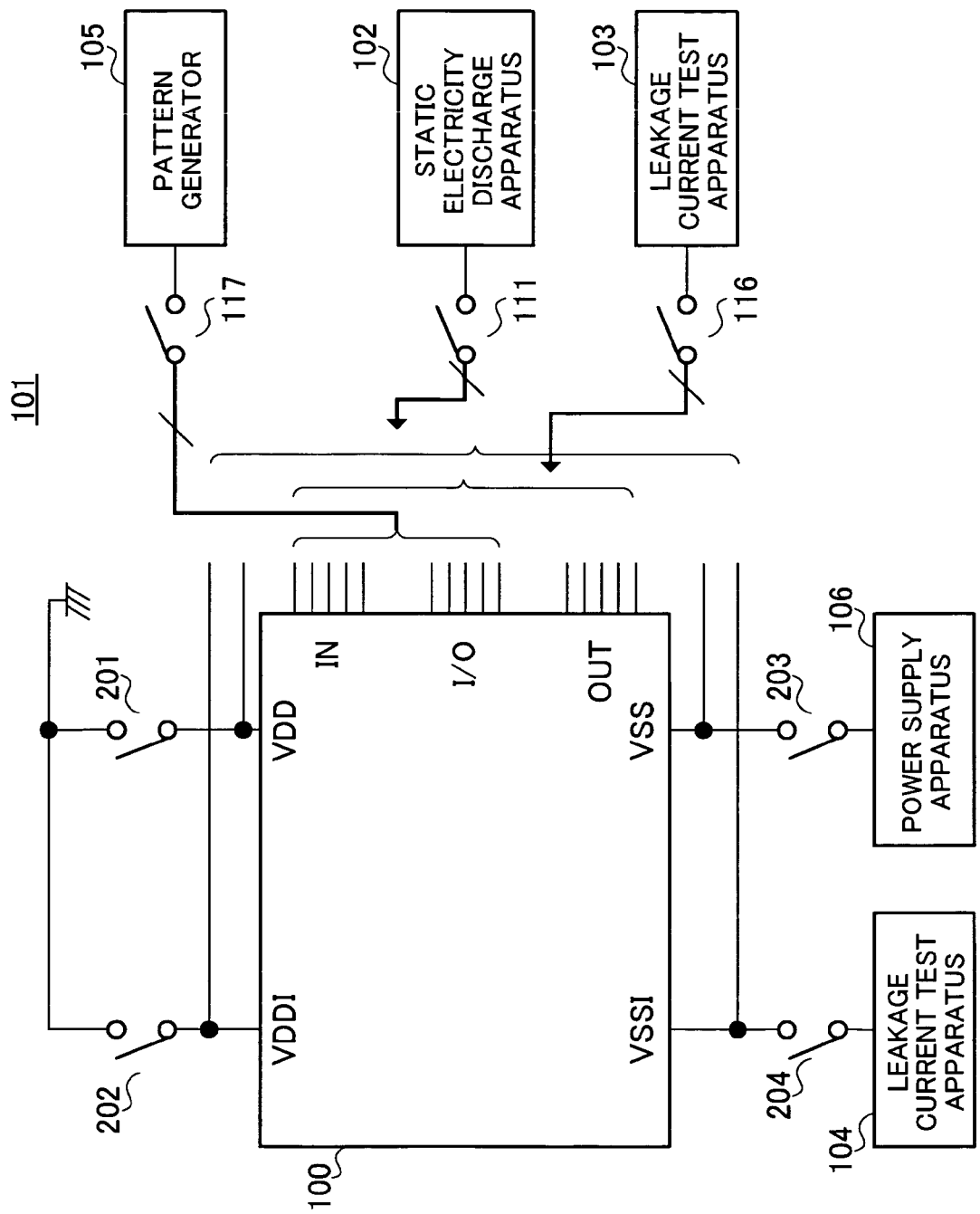
FIG. 4 is a block diagram showing the configuration of an apparatus that implements an electrostatic withstand voltage test method according to Embodiment 2 of the present invention.

FIG. 4 is a block diagram showing the configuration of an apparatus that implements an electrostatic withstand voltage test method according to Embodiment 2 of the present invention. In FIG. 4, configuration elements identical or equivalent to those in FIG. 3 are assigned the same codes as in FIG. 3. The description given here will focus on parts relating to Embodiment 2.

As shown in FIG. 4, in Embodiment 2 IC 100 power supply and ground connection arrangements are the opposite of those in Embodiment 1. That is to say, power supply pins VDD and VDDI are grounded (connected to ground) via switches 201 and 202 respectively, ground pin VSS is connected to power supply apparatus 106 via a switch 203, and ground pin VSSI is connected to leakage current test apparatus 104 via a switch 204.

Electrostatic withstand voltage test apparatus 101 connections with respect to IC 100 are similar to those in Embodiment 1. That is to say, with Embodiment 2, electrostatic withstand voltage testing can be performed using the same kind of procedure as in Embodiment 1, and the same kind of effect can be obtained.

(Embodiment 3)

Figure 5:
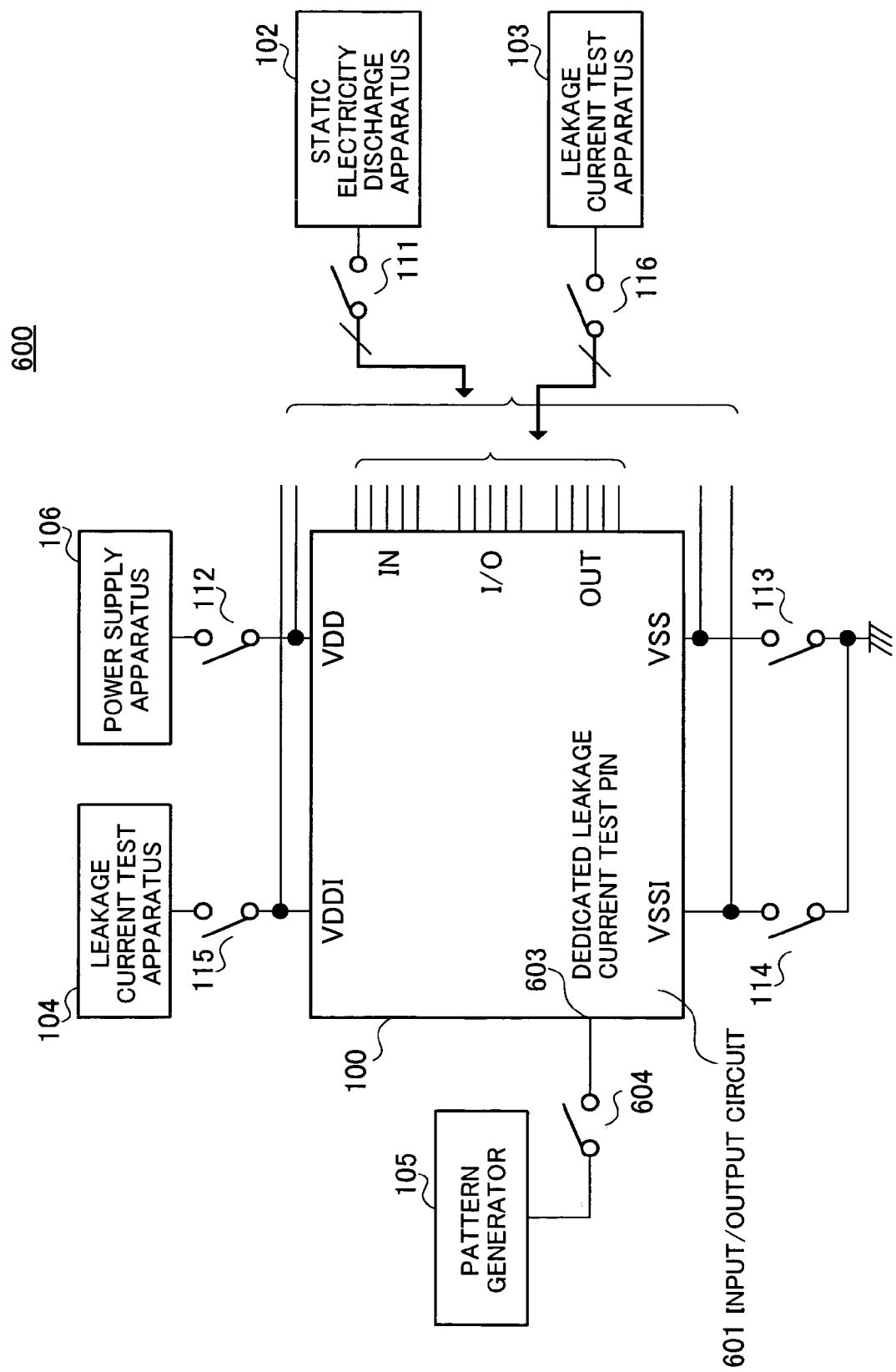
FIG. 5 is a block diagram showing the configuration of an apparatus that implements an electrostatic withstand voltage test method according to Embodiment 3 of the present invention.

FIG. 5 is a block diagram showing the configuration of an apparatus that implements an electrostatic withstand voltage test method according to Embodiment 3 of the present invention. In FIG. 5, configuration elements identical or equivalent to those in FIG. 3 are assigned the same codes as in FIG. 3. The description given here will focus on parts relating to Embodiment 3.

In FIG. 5, electrostatic withstand voltage test apparatus 600 comprises static electricity discharge apparatus 102, leakage current test apparatuses 103 and 104, pattern generator 105, and an input/output circuit 601 which is a dedicated leakage current test circuit mounted on test target IC 100.

Figure 6:
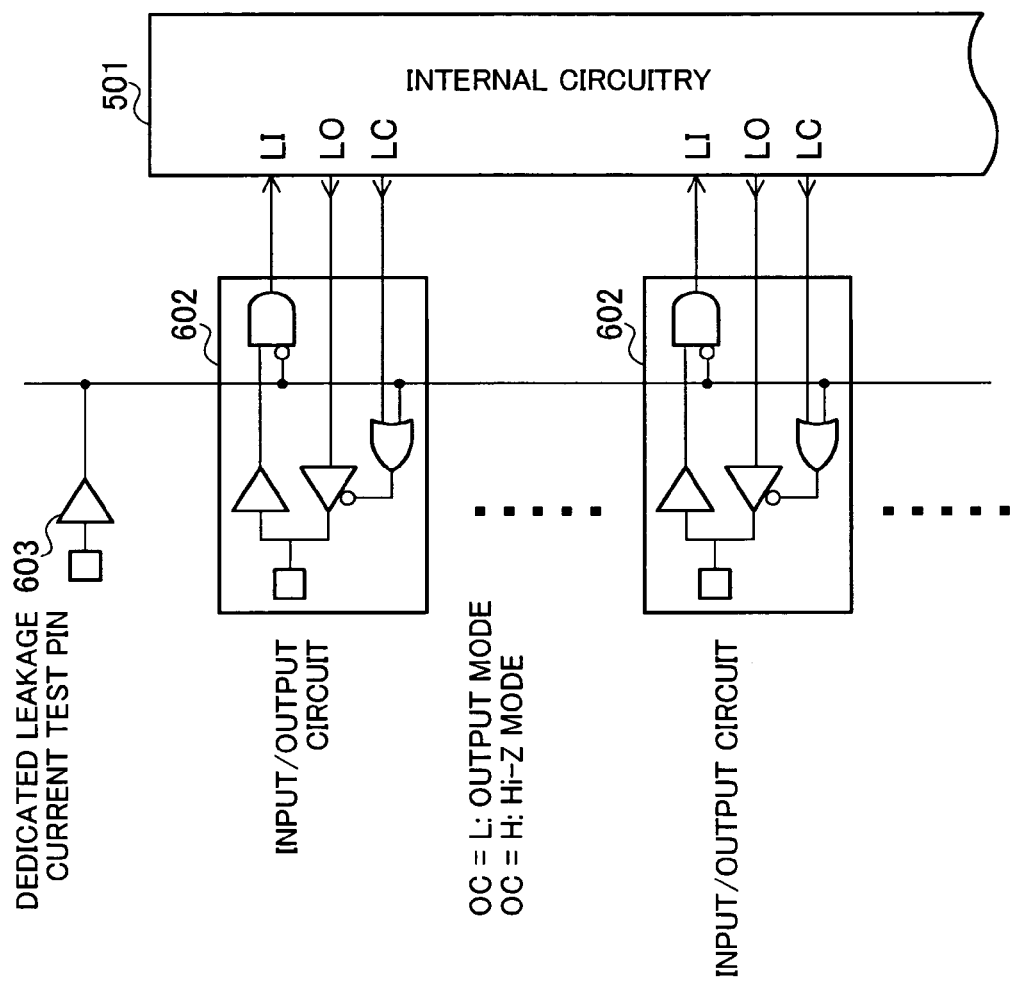
FIG. 6 is a drawing showing the configuration of pin leakage current test enabled input/output circuitry connected to a dedicated leakage current test pin of FIG. 5.

Input/output circuit 601 has a dedicated leakage current test pin 603 connected to it, and comprises a plurality of pin leakage current test enabled input/output circuits, etc., connected to the internal circuitry of IC 100 (see FIG. 6). Dedicated leakage current test pin 603 is connected to pattern generator 105 via a switch 604.

The method of performing IC 100 electrostatic withstand voltage testing by means of electrostatic withstand voltage test apparatus 600 configured as above will now be described.

In FIG. 5, first, with one of switch 113 and switch 114 closed and one of ground pins VSS and VSSI grounded, or with the other of switch 113 and switch 114 closed and the other of ground pins VSS and VSSI grounded, static electricity of an arbitrary voltage is applied from static electricity discharge apparatus 102 to all pins or desired pins other than dedicated leakage current test pin 603 of IC 100 by sequentially closing plurality of switches 111.

Next, switch 112 is closed and power supply pin VDD connected to power supply apparatus 106, and switches 113 and 114 are closed and ground pins VSS and VSSI are grounded. Also, switch 115 is closed and power supply pin VDDI is connected to leakage current test apparatus 104, and switch 604 is closed and a digital signal is applied to dedicated leakage current test pin 603 from pattern generator 105. In this state, pin leakage current testing and power supply leakage current testing can be performed for all pins other than dedicated leakage current test pin 603 by means of leakage current test apparatus 103.

Next, the input/output circuit mounted on IC 100 will be described with reference to FIG. 6. FIG. 6 is a drawing showing the configuration of the dedicated leakage current test pin 603 shown in FIG. 5 and the configuration of pin leakage current test input/output circuitry connected thereto.

In FIG. 6, when the digital signal of dedicated leakage current test pin 603 is set to a high level (1), a signal is transmitted to each input/output circuit via a buffer, pins of each input/output circuit are placed in high-impedance mode, and a signal input to internal circuitry 501 can be set to a low level (0). Therefore, the leakage current testing precision of all pins other than dedicated leakage current test pin 603 can be improved.

(Embodiment 4)

Figure 7:
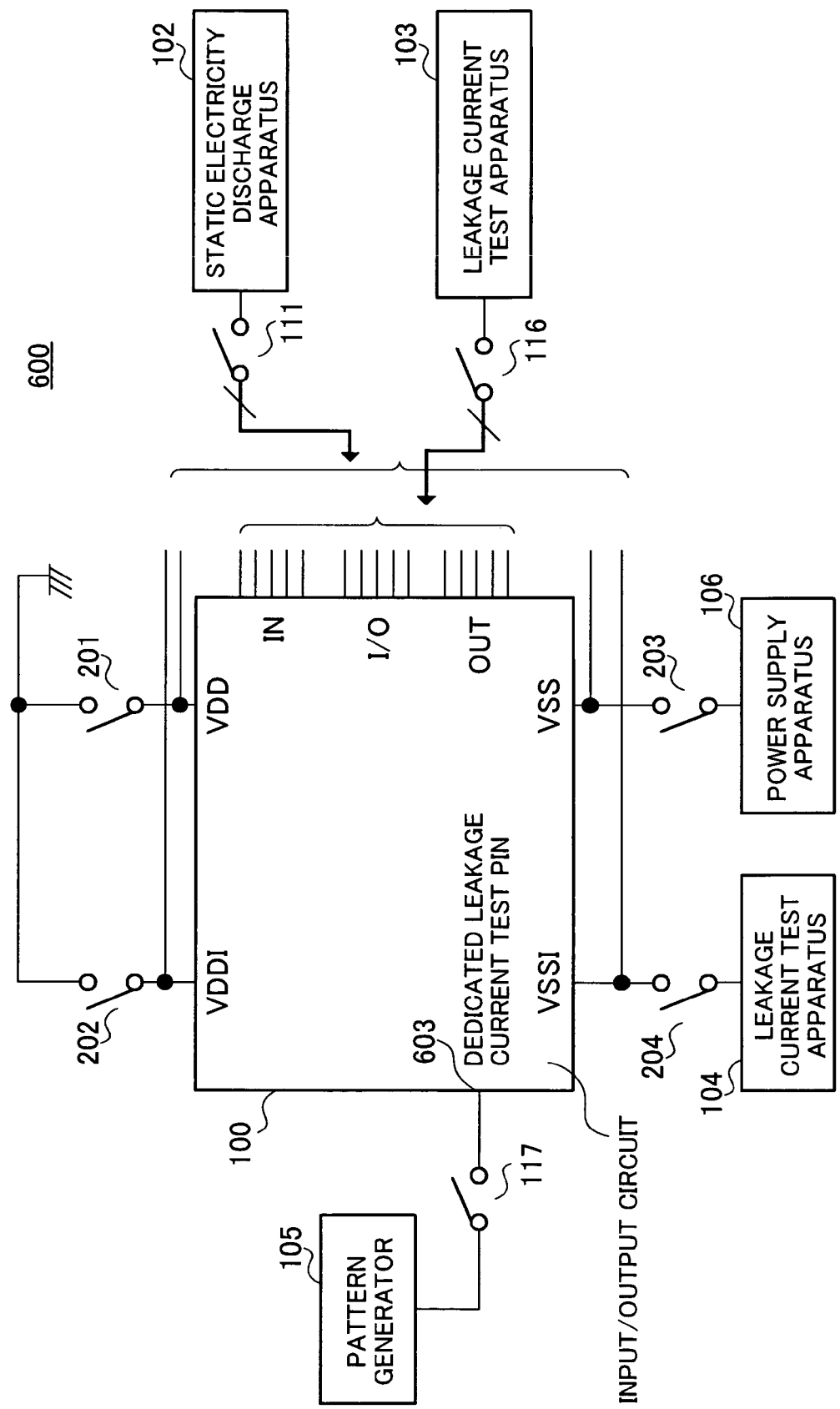
FIG. 7 is a block diagram showing the configuration of an apparatus that implements an electrostatic withstand voltage test method according to Embodiment 4 of the present invention.

FIG. 7 is a block diagram showing the configuration of an apparatus that implements an electrostatic withstand voltage test method according to Embodiment 4 of the present invention. In FIG. 7, configuration elements identical or equivalent to those in FIG. 6 are assigned the same codes as in FIG. 6. The description given here will focus on parts relating to Embodiment 4.

As shown in FIG. 7, in Embodiment 4 IC 100 power supply and ground connection arrangements are the opposite of those in Embodiment 3. That is to say, power supply pins VDD and VDDI are grounded (connected to ground) via switches 201 and 202 respectively, ground pin VSS is connected to power supply apparatus 106 via switch 203, and ground pin VSSI is connected to leakage current test apparatus 104 via switch 204.

Electrostatic withstand voltage test apparatus 600 connections with respect to IC 100 are similar to those in Embodiment 3. That is to say, with Embodiment 4, electrostatic withstand voltage testing can be performed using the same kind of procedure as in Embodiment 3, and the same kind of effect can be obtained.

(Embodiment 5)

Figure 8:
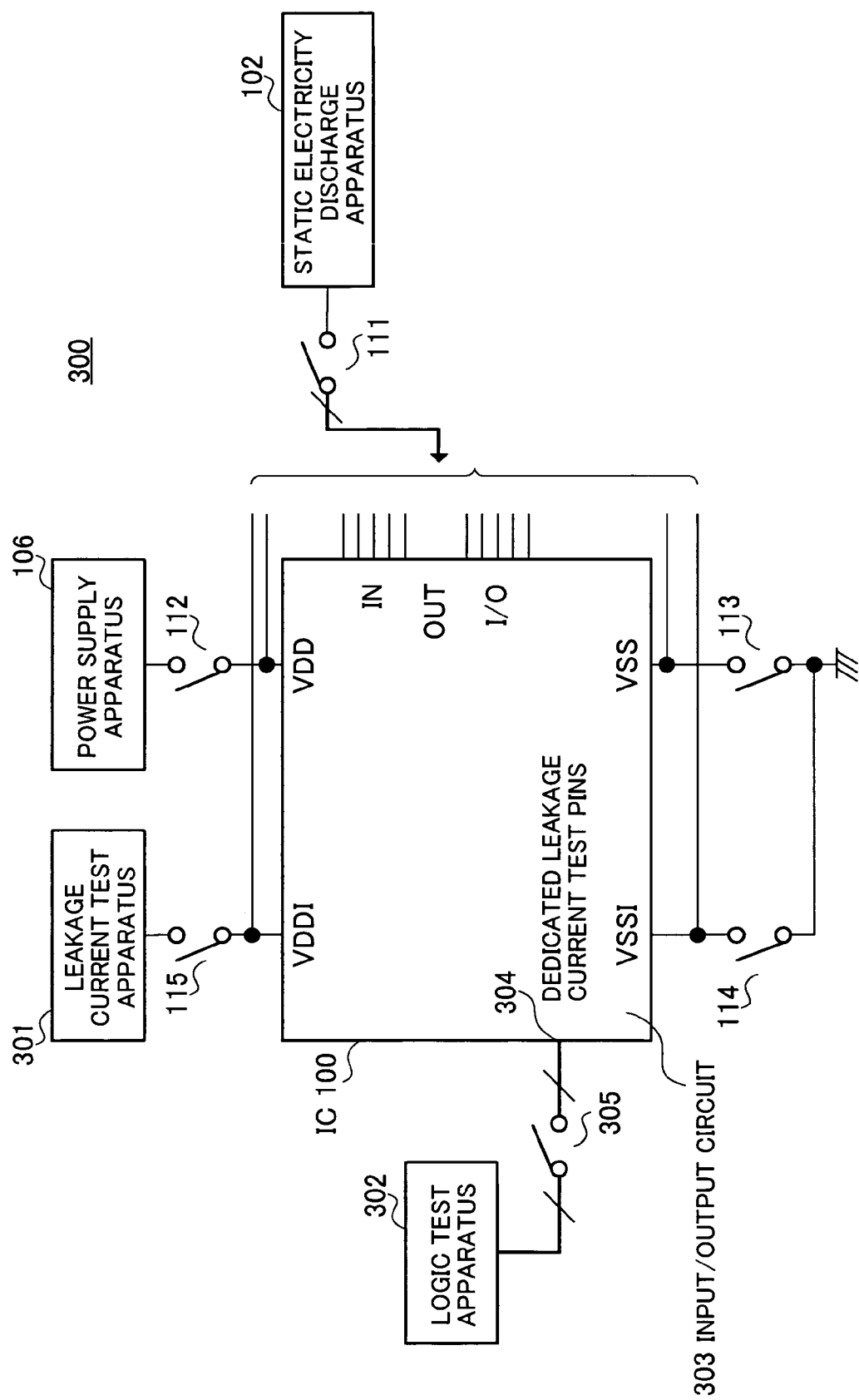
FIG. 8 is a block diagram showing the configuration of an apparatus that implements an electrostatic withstand voltage test method according to Embodiment of the present invention.

FIG. 8 is a block diagram showing the configuration of an apparatus that implements an electrostatic withstand voltage test method according to Embodiment of the present invention. In FIG. 8, configuration elements identical or equivalent to those in FIG. 3 are assigned the same codes as in FIG. 3. The description given here will focus on parts relating to Embodiment 5.

In FIG. 8, electrostatic withstand voltage test apparatus 300 comprises static electricity discharge apparatus 102, a leakage current test apparatus 301 replacing leakage current test apparatus 104, an added leakage current test apparatus 302, and an input/output circuit 303 which is a dedicated leakage current test circuit mounted on test target IC 100.

Figure 9:
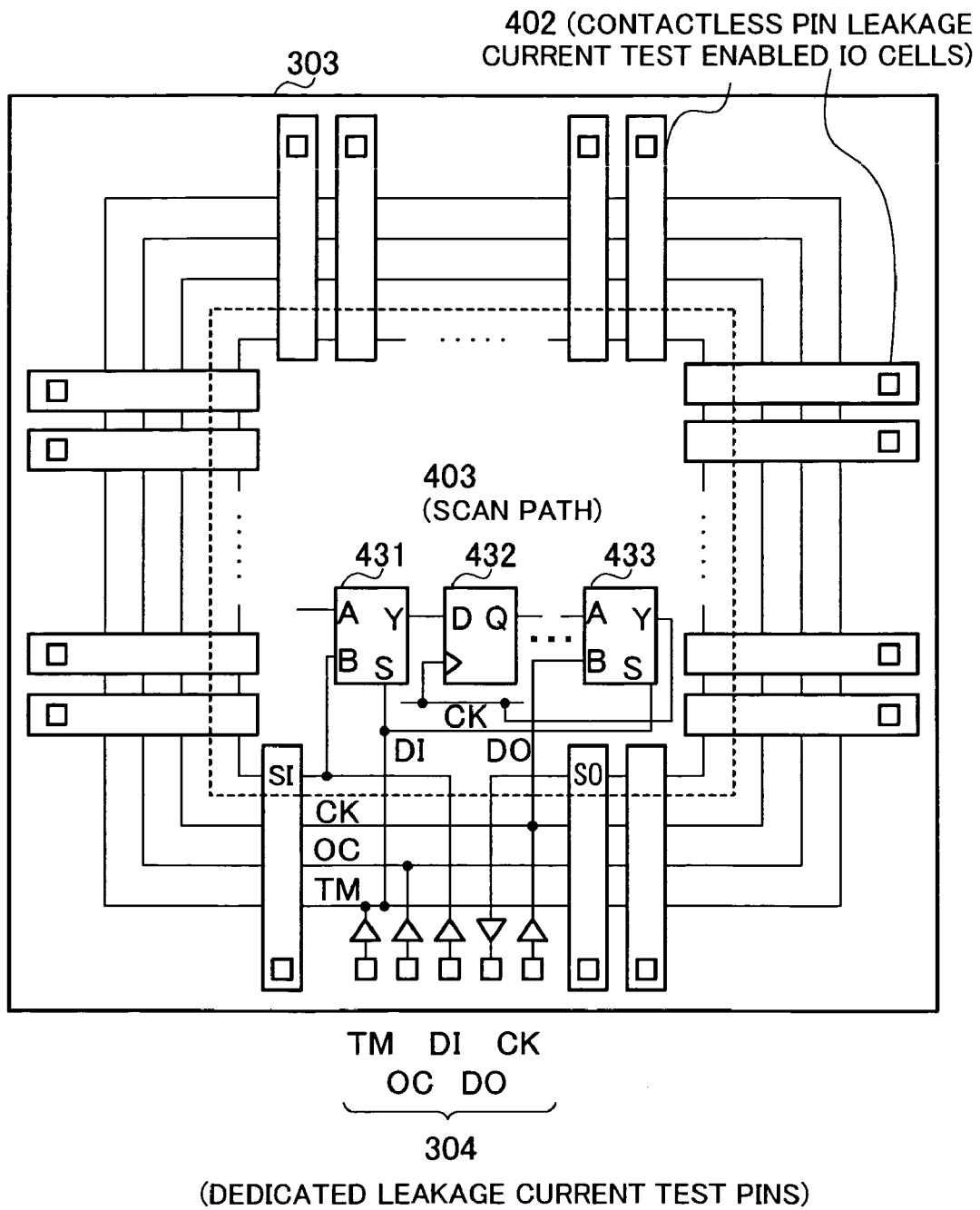
FIG. 9 is a drawing showing the configuration of dedicated leakage current test pins shown in FIG. 7 and FIG. 8 and the arrangement of contactless pin leakage current test enabled input/output circuitry connected thereto.
Figure 10:
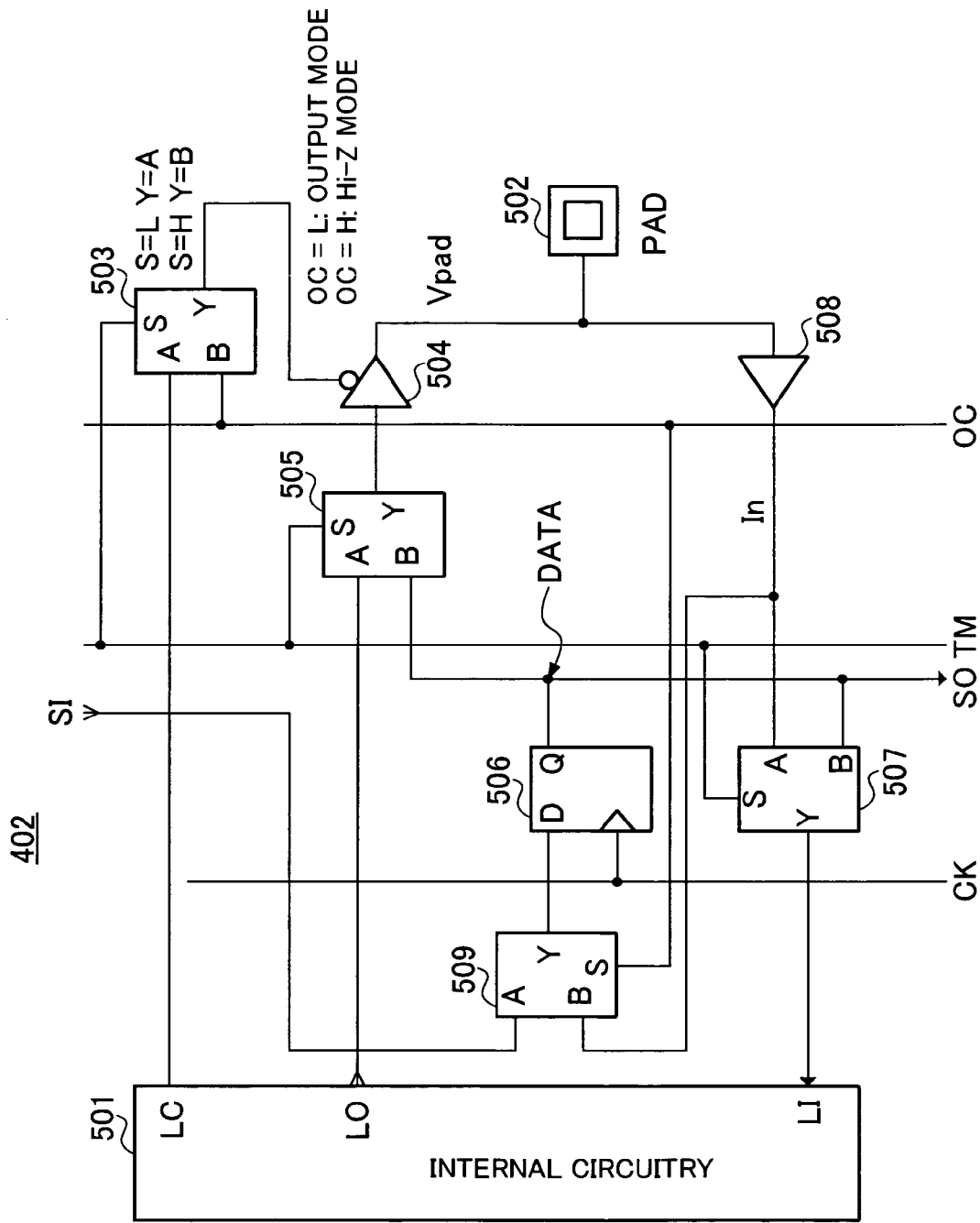
FIG. 10 is a drawing showing the configuration of a contactless pin leakage current test enabled input/output circuit shown in FIG. 9.

Input/output circuit 303 is connected to dedicated leakage current test pins 304 via a buffer, and comprises a contactless pin leakage current test input/output circuit, etc., connected to the internal circuitry of IC 100 (see FIG. 9 and FIG. 10). Dedicated leakage current test pins 304 are connected to a logic test apparatus 302 via a plurality of switches 305.

The contactless pin leakage current test input/output circuit, etc., to which dedicated leakage current test pins 304 are connected will be described later herein. The method of performing IC 100 electrostatic withstand voltage testing by means of electrostatic withstand voltage test apparatus 300 configured as above will now be described.

In FIG. 8, first, with one of switch 113 and switch 114 closed and one of ground pins VSS and VSSI grounded, or with the other of switch 113 and switch 114 closed and the other of ground pins VSS and VSSI grounded, static electricity of an arbitrary voltage is applied from static electricity discharge apparatus 102 to all pins or desired pins other than dedicated leakage current test pins 304 of IC 100 by sequentially closing plurality of switches 111.

Next, switch 112 is closed and power supply pin VDD is connected to power supply apparatus 106, switch 113 is closed and ground pin VSS is grounded, and switch 114 is closed and ground pin VSSI is grounded. Also, switch 115 is closed and power supply pin VDDI is connected to leakage current test apparatus 301. In this state, plurality of switches 305 are closed and digital signals are applied from logic test apparatus 302 to dedicated leakage current test pins 304, and the logic of digital signals output from dedicated leakage current test pins 304 is tested. By this means, pin leakage current testing is performed. It is also possible to apply digital signals from logic test apparatus 302 to dedicated leakage current test pins 304 and perform power supply leakage current testing by means of leakage current test apparatus 301.

Next, input/output circuit 303 mounted on IC 100 will be described with reference to FIG. 9 and FIG. 10. FIG. 9 is a drawing showing the configuration of dedicated leakage current test pins shown in FIG. 8 and the arrangement of contactless pin leakage current test enabled input/output circuitry connected thereto, and FIG. 10 is a drawing showing the configuration of a contactless pin leakage current test enabled input/output circuit shown in FIG. 9.

Figure 1:
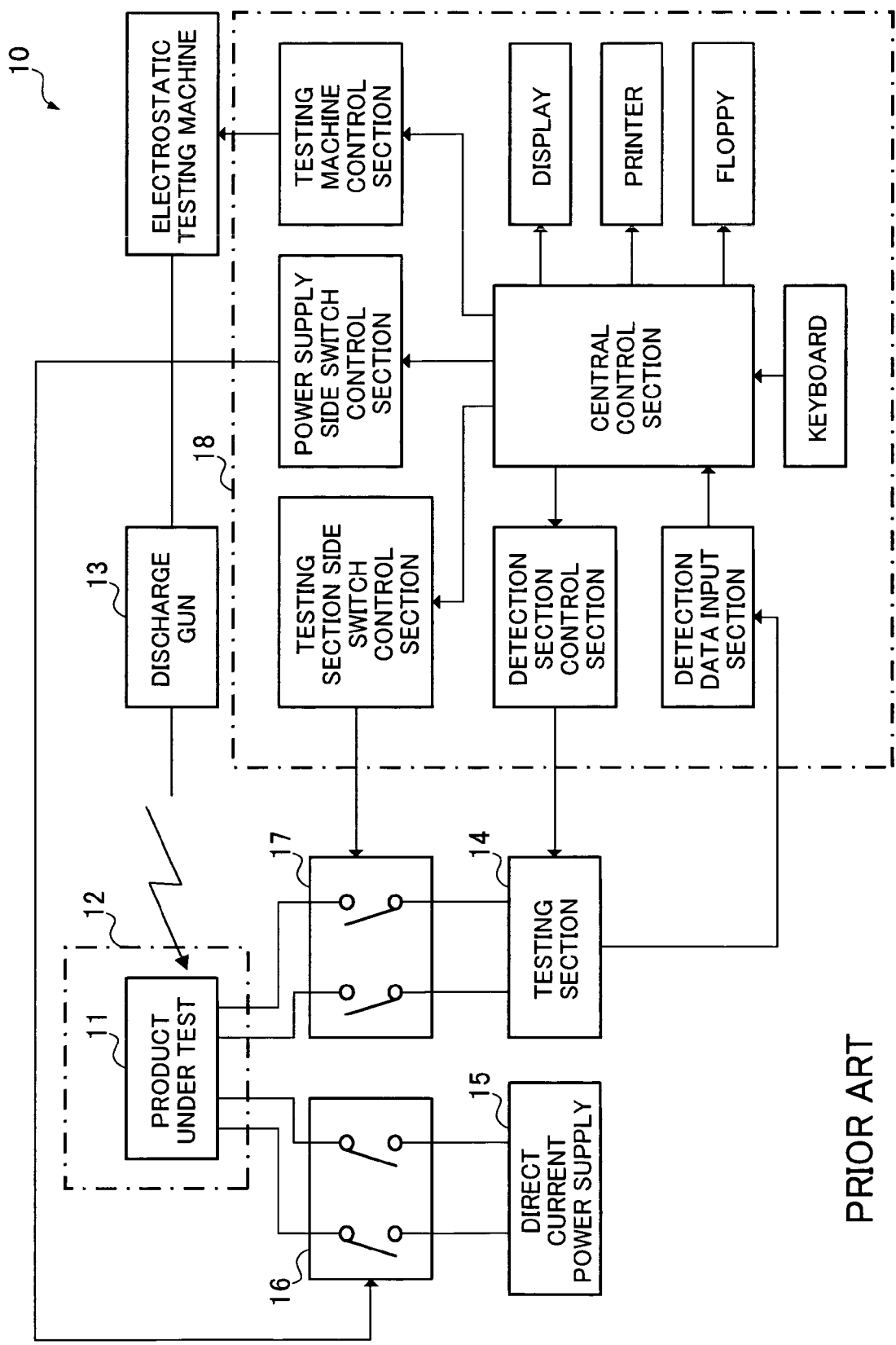
FIG. 1 is a block diagram showing an exemplary configuration of a conventional electrostatic withstand voltage test apparatus.
Figure 2:
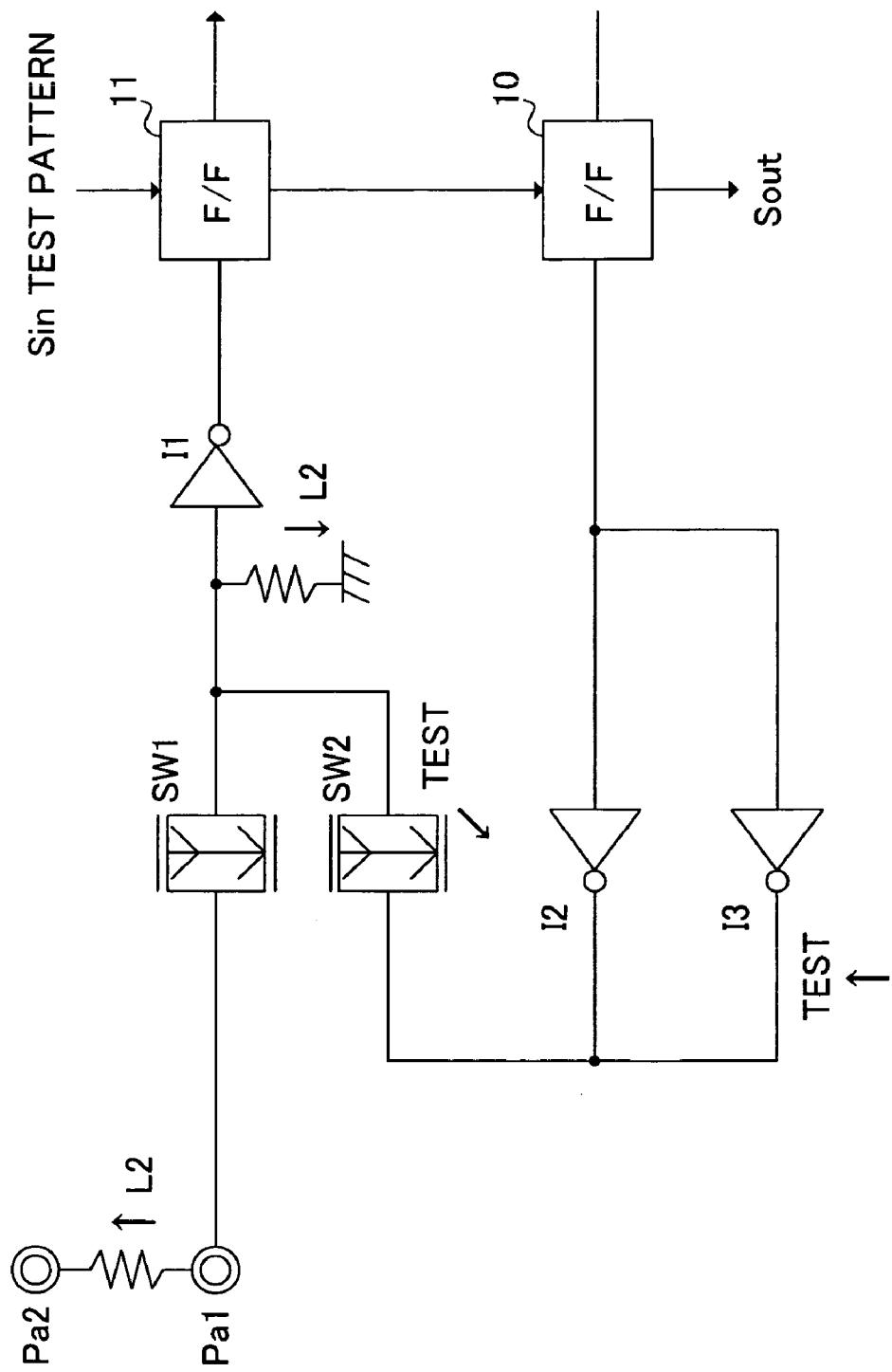
FIG. 2 is a drawing showing an exemplary configuration of a conventional contactless pin leakage current test circuit.

With regard to a contactless pin leakage current test enabled input/output circuit, the circuit disclosed in Unexamined Japanese Patent Publication No. HEI 10-123212 is known, for example. FIG. 2 is a drawing showing an exemplary configuration of a conventional contactless pin leakage current test circuit.

In this example of the conventional art, each input/output circuit has two flip-flops, and using a plurality of test drivers of differing drive capability configured in parallel, pin leakage testing is performed without pad contact, and leakage current testing is performed by reading to an external destination using the flip-flops arranged in the above-described chain configuration.

In FIG. 9, in input/output circuit 303, numerous contactless pin leakage current test enabled input/output circuits 402, to which dedicated leakage current test pins 304 are connected via buffers, are arranged in ring form, and a scan path 403 is also provided.

Dedicated leakage current test pins 304 comprise five pins: a TM (test mode) pin, OC (output control) pin, CK (clock) pin, DI (data input) pin, and DO (data output) pin.

The TM, OC, and CK pins are connected to pins of the same name of contactless pin leakage current test enabled IO cells 402. The DI pin is connected to the SI pin of the nearest contactless pin leakage current test enabled IO cell 402, and the DO pin is connected to the SO pin of another contactless pin leakage current test input/output cell.

Scan path 403 comprises selectors 431 and 433 that connect either input pin A or B to output pin Y according to the signal level of the TM pin, a flip-flop 432 that takes the output of selector 431 as data input and takes the output of selector 433 as clock input, and a plurality of similar selectors and flip-flops.

As shown in FIG. 10, a contactless pin leakage current test enabled input/output circuit 402 is configured with a dedicated leakage current test flip-flop 506, selectors 503, 505, 507, and 509, an output buffer 504, and an input buffer 508, located between internal circuitry 501 and pad 502.

A signal applied to the SI pin in FIG. 10 is input to dedicated leakage current test flip-flop 506 via selector 509, and is output from dedicated leakage current test flip-flop 506 to the SO pin. Therefore, by sequentially connecting the SI pin and SO pin of each contactless pin leakage current test enabled input/output circuit 402, a dedicated leakage current test flip-flop chain providing linkage from the DI pin to the DO pin is formed. By this means, it is possible to test for the presence or absence of leakage current by means of input/output circuit 303 even with pad 502 not in contact with a pin from outside.

Also, when scan path 403 is composed of a plurality of scan path flip-flop chains, the data input of the flip-flop at the head of each flip-flop chain is connected to an arbitrary place in the dedicated leakage current test flip-flop chain via a selector of the same kind as selector 431. Scan path flip-flop chain clock signal switching is also performed in the same way as with selector 433. As a different method, scan path flip-flop chains are linked into one via selectors, and the data input of the flip-flop at the head of the first flip-flop chain is connected to an arbitrary place in the above-described dedicated leakage current test flip-flop chain providing linkage from the DI pin to the DO pin via selector 431. Also, by connecting the clock of each scan path flip-flop chain to dedicated leakage current test pin CK via selector 433, it is possible to set the state of internal circuitry 501 arbitrarily even with pad 502 not in contact with a pin from outside, and to perform power supply leakage current testing of internal circuitry 501.

Figure 11:
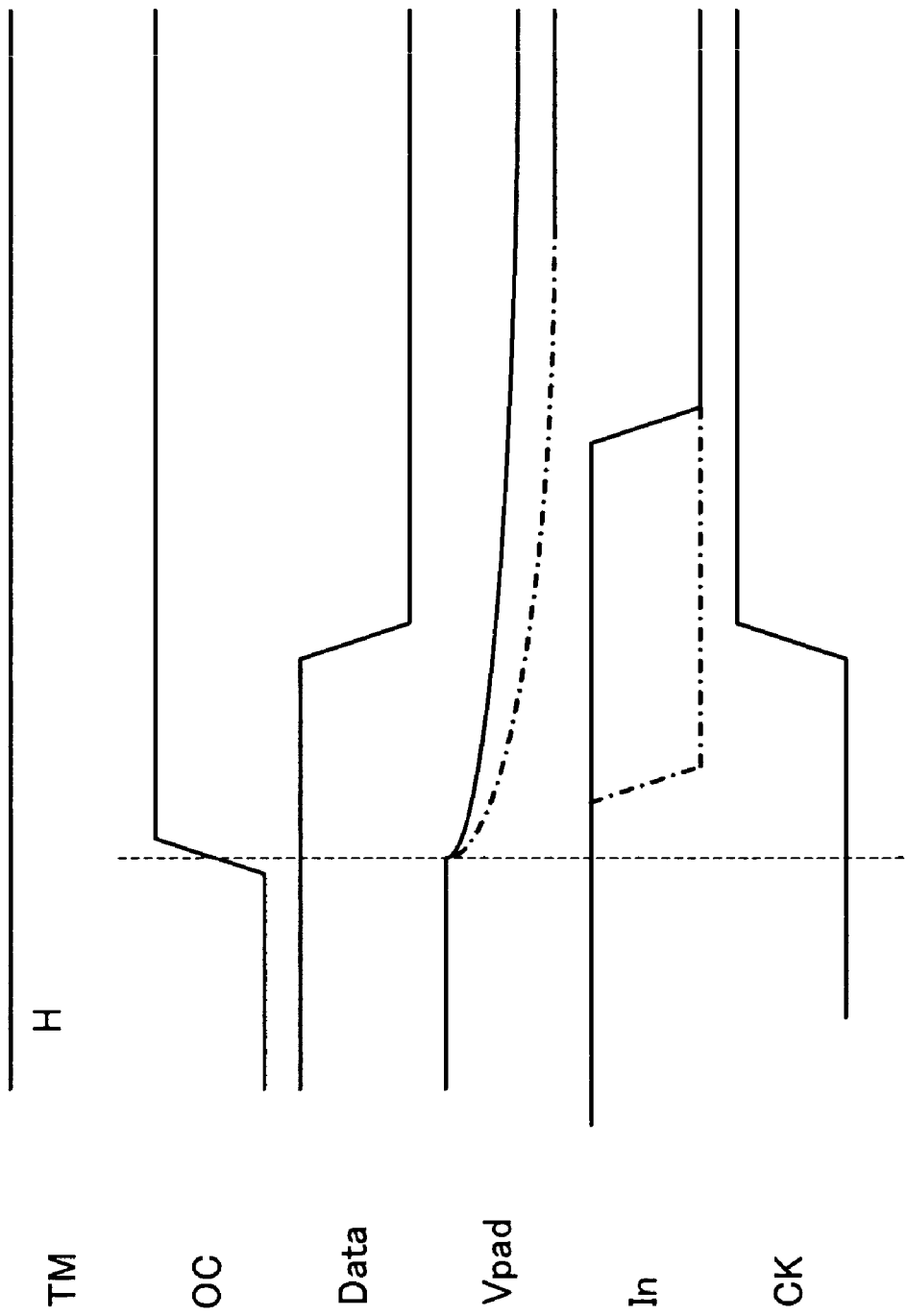
FIG. 11 is a timing chart explaining a contactless pin leakage current test using dedicated leakage current test pins shown in FIG. 8.

Next, the contents of a contactless pin leakage current test performed by pad 502 will be described with reference to FIG. 8 through FIG. 11. FIG. 11 is a timing chart explaining a contactless pin leakage current test using the dedicated leakage current test pins shown in FIG. 8.

In FIG. 8 through FIG. 11, the TM pin output is first set to the H level, setting test mode. By this means, selectors 503, 505, and 507 perform selection. That is to say, in the case of selector 503, internal circuitry 501 LC pin output is input to one input pin A, and OC pin output is input to the other input pin B, but when an H level is input to the S pin, OC pin output is selected and sent to the control side of output buffer 504.

Also, in the case of selector 505, internal circuitry 501 LC pin output is input to one input pin A, and the output of dedicated leakage current test flip-flop 506 is input to the other input pin B, but when an H level is input to the S pin, dedicated leakage current test flip-flop 506 output is selected and sent to the input side of output buffer 504.

Furthermore, in the case of selector 507, the output of input buffer 508 is input to one input pin A, and the output of dedicated leakage current test flip-flop 506 is input to the other input pin B, but when an H level is input to the S pin, dedicated leakage current test flip-flop 506 output is selected and sent to the LI pin of internal circuitry 501. The output side of output buffer 504 and the input side of input buffer 508 are both connected to pad 502.

Next, data is input from the DI pin. The input data is sent from the SI pin to one input side A of selector 509. The output of input buffer 508 is sent to the other input side B of selector 509. When OC pin output is at the L level, selector 509 sends data from the SI pin to dedicated leakage current test flip-flop 506. With dedicated leakage current test flip-flop 506, capture is performed by means of the clock from the CK pin, and the output, Data, is set to the H level.

By this means, the output of above-described flip-flop 506 is sent to output buffer 504. As output buffer 504 is in output mode, pad 502 voltage Vpad goes to the H level. Also, selector 507 sends the above flip-flop 506 output to the LI pin of internal circuitry 501.

Next, OC pin output is changed from the L level to the H level. As a result, output pin Y of selector 503 goes to the H level, and output buffer 504 changes from output mode to high-impedance mode (Hi-Z), so that if there is a leakage current on the L level side, pad 502 voltage Vpad changes from the H level to the L level. The degree of change is determined in proportion to the leakage current. Therefore, output In of input buffer 508 remains at the H level if there is no leakage current, or immediately changes to the L level if there is a leakage current.

As selector 509 has selected input buffer 508 output and is sending this output to dedicated leakage current test flip-flop 506, CK pin output is changed from the L level to the H level at appropriate timing, and input buffer output In is captured in flip-flop 506. Then output is performed from the SO pin to the DO pin by means of a shift operation, and the flip-flop 506 signal is read. By this means, it is possible to determine whether or not there is an L level side pin leakage current in contactless pin leakage current test enabled input/output circuit 402.

In the same way as described above, by setting flip-flop 506 output Data to the L level, it is possible to determine whether or not there is an H level side pin leakage current. If the above operations are performed in each of the many arrayed contactless pin leakage current test enabled input/output circuits 402, testing can be carried out for all IC 100 pins except the dedicated leakage current test pins, power supply pins, and ground pins.

In Embodiment 5, dedicated leakage current test pins 304 and an IO cell section that is provided with contactless pin leakage current test enabled input/output circuits forming a dedicated leakage current test flip-flop chain are added to an IC, and pin leakage current testing and power supply leakage current testing can be performed without contact with pins from outside, enabling the number of pins required for leakage current testing to be greatly decreased compared with Embodiments 1 through 4. In other words, while Embodiments 1 through 4 are suitable for electrostatic withstand voltage testing for a comparatively small-scale IC, Embodiment 5 is extremely effective when the number of pins increases or the circuit scale is larger.

(Embodiment 6)

Figure 12:
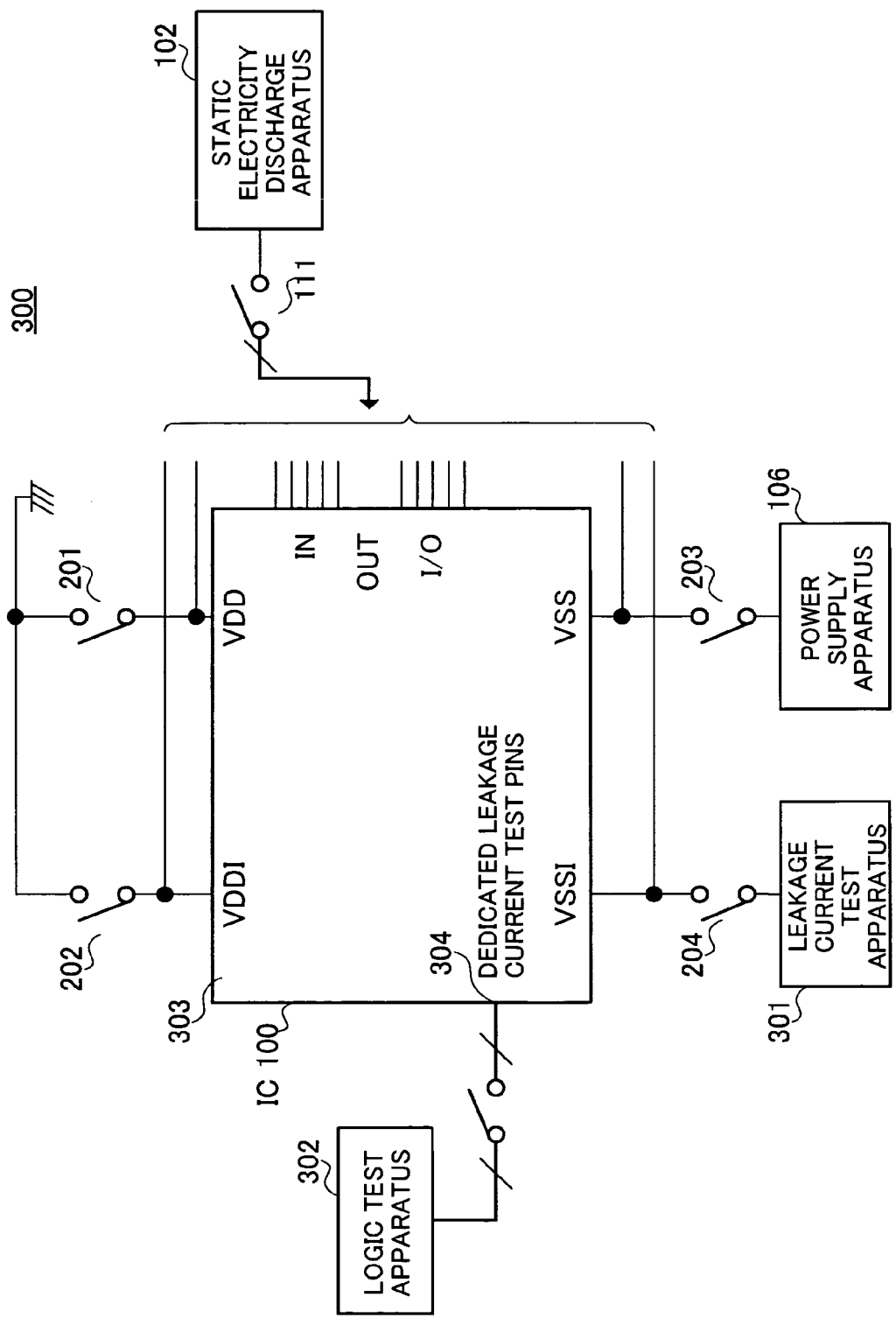
FIG. 12 is a block diagram showing the configuration of an apparatus that implements an electrostatic withstand voltage test method according to Embodiment 6 of the present invention.

FIG. 12 is a block diagram showing the configuration of an apparatus that implements an electrostatic withstand voltage test method according to Embodiment 6 of the present invention. In FIG. 12, configuration elements identical or equivalent to those in FIG. 8 are assigned the same codes as in FIG. 8. The description given here will focus on parts relating to Embodiment 6.

As shown in FIG. 12, in Embodiment 6 IC 100 power supply and ground connection arrangements are the opposite of those in Embodiment 5. That is to say, power supply pins VDD and VDDI are grounded (connected to ground) via switches 201 and 202 respectively, ground pin VSS is connected to power supply apparatus 106 via switch 203, and ground pin VSSI is connected to leakage current test apparatus 301 via switch 204.

Electrostatic withstand voltage test apparatus 300 connections with respect to IC 100 are similar to those in Embodiment 5. That is to say, with Embodiment 6, electrostatic withstand voltage testing can be performed using the same kind of procedure as in Embodiment 5, and the same kind of effect can be obtained.

(Embodiment 7)

Figure 13:
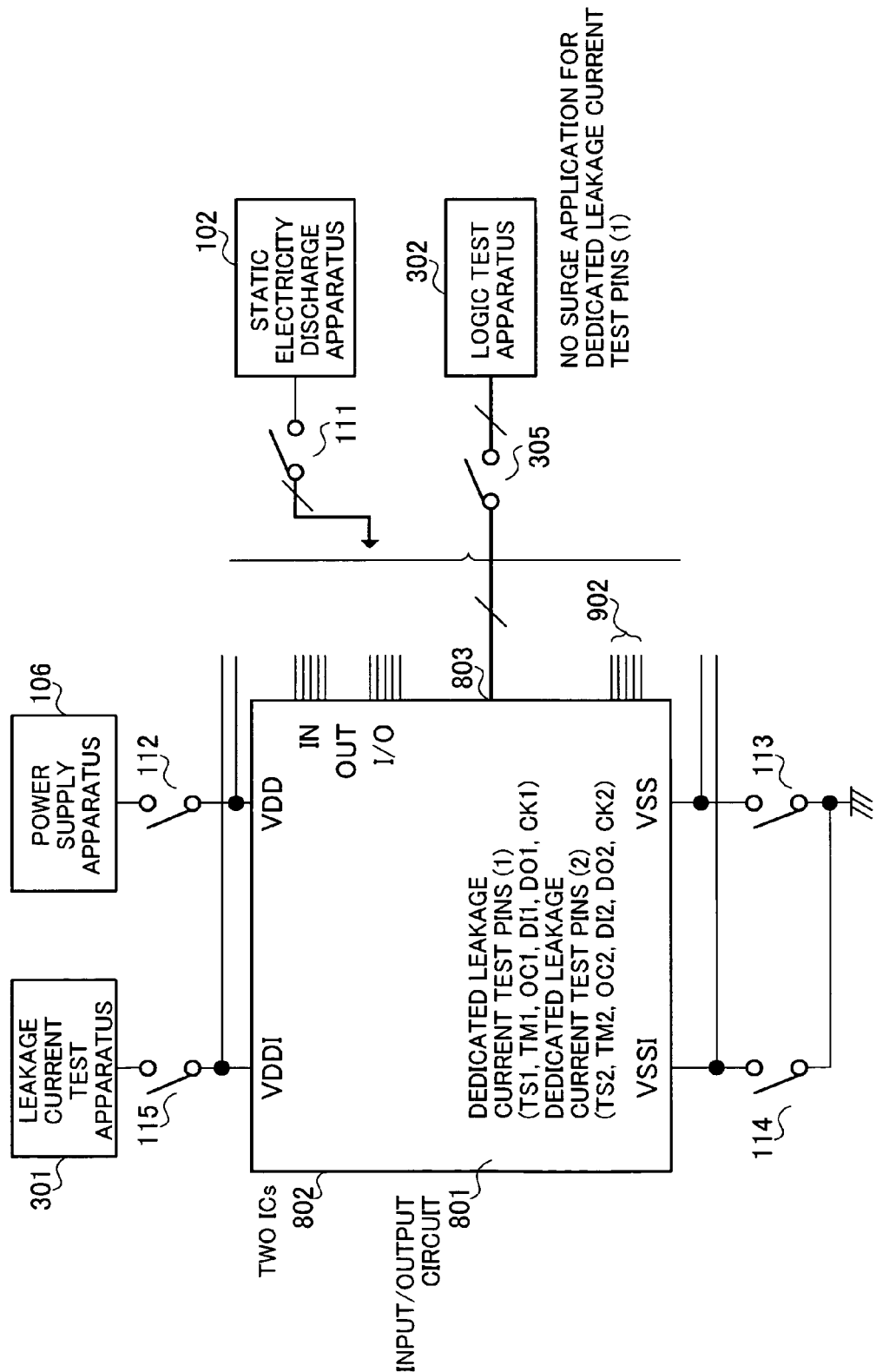
FIG. 13 is a block diagram showing the configuration of an apparatus that implements an electrostatic withstand voltage test method according to Embodiment 7 of the present invention.
Figure 14:
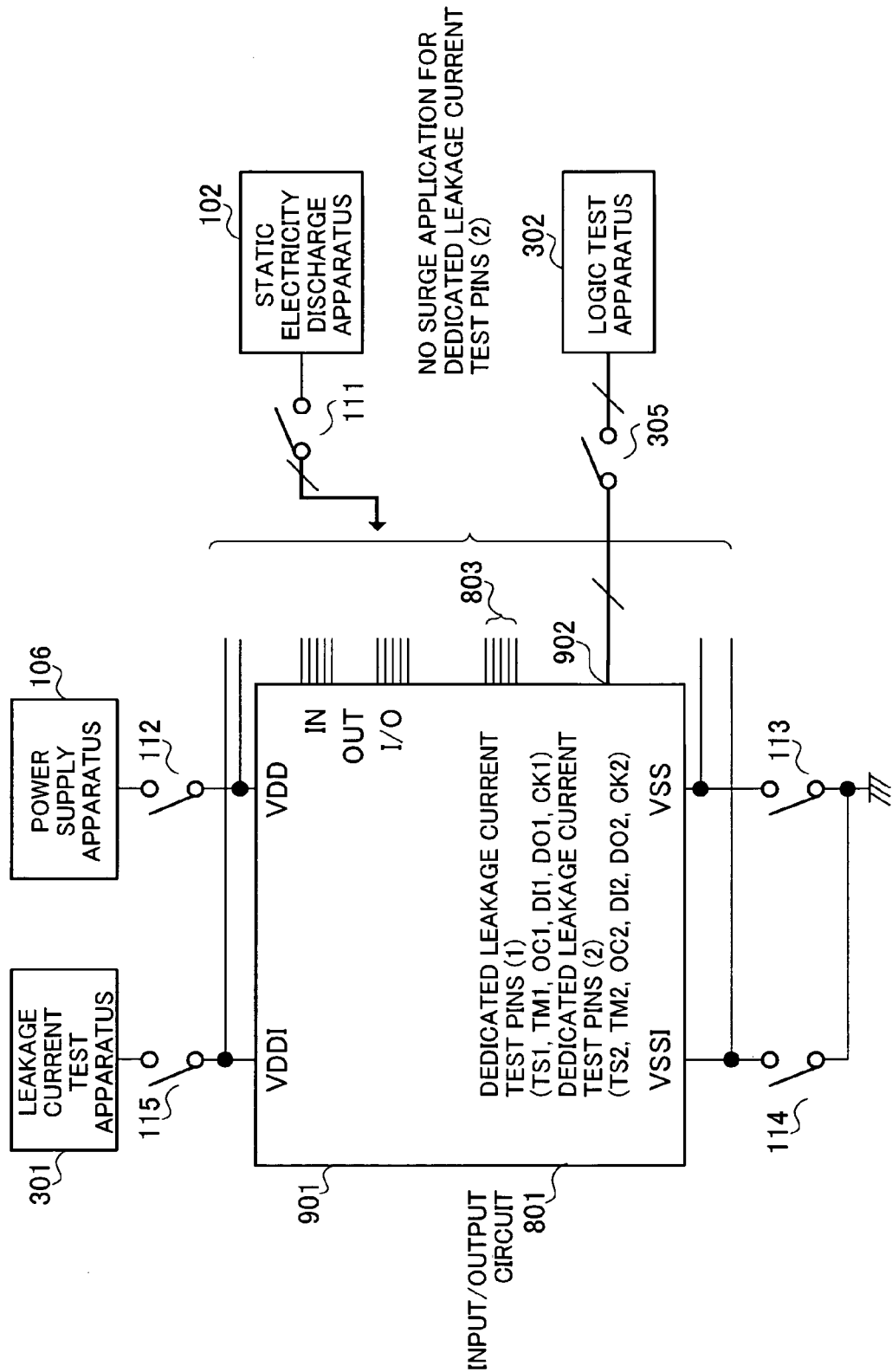
FIG. 14 is a block diagram showing the configuration of an apparatus that implements an electrostatic withstand voltage test method according to Embodiment 7 of the present invention.

FIG. 13 and FIG. 14 are block diagrams showing configurations of an apparatus that implements an electrostatic withstand voltage test method according to Embodiment 7 of the present invention. In FIG. 13 and FIG. 14, configuration elements identical or equivalent to those in FIG. 8 are assigned the same codes as in FIG. 8. The description given here will focus on parts relating to Embodiment 7.

In Embodiment 7 of the present invention, an exemplary configuration in a case where electrostatic withstand voltage testing is performed in parallel for two ICs is show as an application example of Embodiment 5. That is to say, in FIG. 13 and FIG. 14, input/output circuit 801 is provided with dedicated leakage current test pins (1) 803 and dedicated leakage current test pins (2) 902 to enable electrostatic withstand voltage testing to be performed on two ICs 802 and 901 in parallel.

In FIG. 13, pins 803 are connected to logic test apparatus 302 via plurality of switches 305. In FIG. 14, pins 902 are connected to logic test apparatus 302 via plurality of switches 305.

Dedicated leakage current test pins (1) 803 comprise a TM1 (test mode 1) pin, OC1 (output control) pin, DI1 (data input 1) pin, DO1 (data output 1) pin, and CK (clock) pin, plus a TS1 (test select 1) pin.

Dedicated leakage current test pins (2) 902 comprise a TM2 (test mode 2) pin, OC2 (output control) pin, DI2 (data input 2) pin, DO2 (data output 2) pin, and CK (clock) pin, plus a TS2 (test select 2) pin.

Basically, as with input/output circuit 303 described in Embodiment 5, these dedicated leakage current test pins are connected to contactless pin leakage current test enabled IO cells that form a dedicated leakage current test flip-flop chain, but as shown in FIG. 15 through FIG. 18, they can be switched for use (described later herein).

FIG. 13 shows a case in which a leakage current test is performed on one IC 802 using dedicated leakage current test pins (1) 803. That is to say, in FIG. 13, with one of switches 113 and 114 closed and one of IC 802 ground pins VSS and VSSI grounded (connected to ground), plurality of switches 111 are closed and static electricity of an arbitrary voltage is applied from static electricity discharge apparatus 102 to all pins or desired pins of IC 802 other than dedicated leakage current test pins (1) 803. The reason for not applying static electricity to dedicated leakage current test pins (1) 803 is to prevent control becoming impossible when performing a leakage current test through electrostatic breakdown.

Next, switch 112 is closed and power supply pin VDD is connected to power supply apparatus 106 of IC 802, switch 113 is closed and ground pin VSS of IC 802 is grounded, and switch 114 is closed and ground pin VSSI of IC 802 is grounded. In addition, switch 115 is closed and power supply pin VDDI of IC 802 is connected to leakage current test apparatus 301. In this state, plurality of switches 305 are closed and digital signals from logic test apparatus 302 are applied to dedicated leakage current test pins (1), and the logic of digital signals output from dedicated leakage current test pins (1) is tested. By this means, pin leakage current testing and power supply leakage current testing can be performed for IC 802.

FIG. 14 shows a case in which a leakage current test is performed on the other IC 901 using dedicated leakage current test pins (2) 902. That is to say, in FIG. 14, with one of switches 113 and 114 closed and one of IC 901 ground pins VSS and VSSI grounded (connected to ground), plurality of switches 111 are closed and static electricity of an arbitrary voltage is applied from static electricity discharge apparatus 102 to all pins or desired pins of IC 901 other than dedicated leakage current test pins (2) 902.

Next, switch 112 is closed and power supply pin VDD is connected to power supply apparatus 106 of IC 901, switch 113 is closed and ground pin VSS of IC 901 is grounded, and switch 114 is closed and ground pin VSSI of IC 901 is grounded. In addition, switch 115 is closed and power supply pin VDDI of IC 901 is connected to leakage current test apparatus 301. In this state, plurality of switches 305 are closed and digital signals from logic test apparatus 302 are applied to dedicated leakage current test pins (2) 902, and the logic of digital signals output from dedicated leakage current test pins (2) is tested. By this means, pin leakage current testing and power supply leakage current testing can be performed for IC 901.

Figure 15:
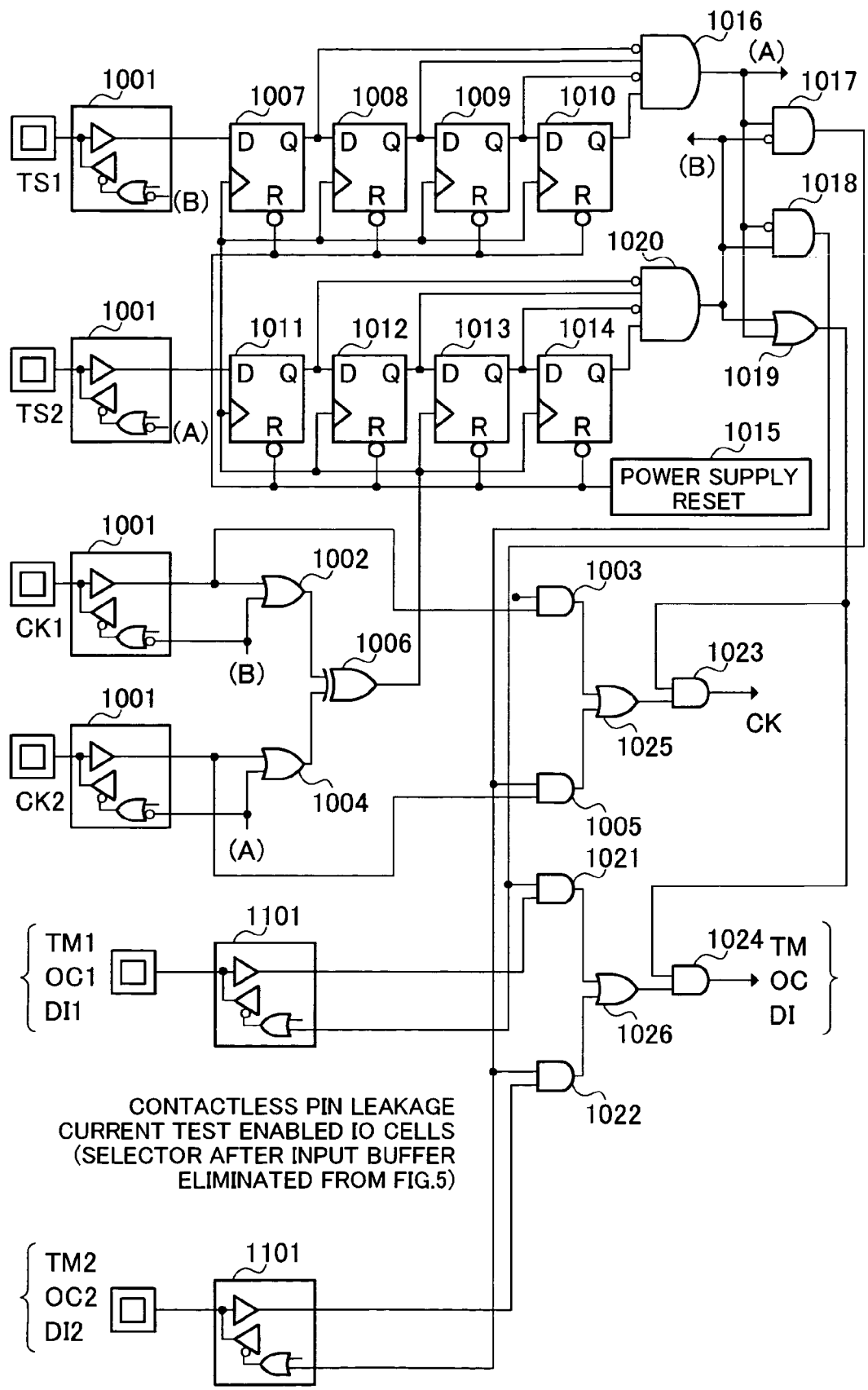
FIG. 15 is a drawing showing an exemplary configuration of an input/output circuit shown in FIG. 13 and FIG. 14.
Figure 16:
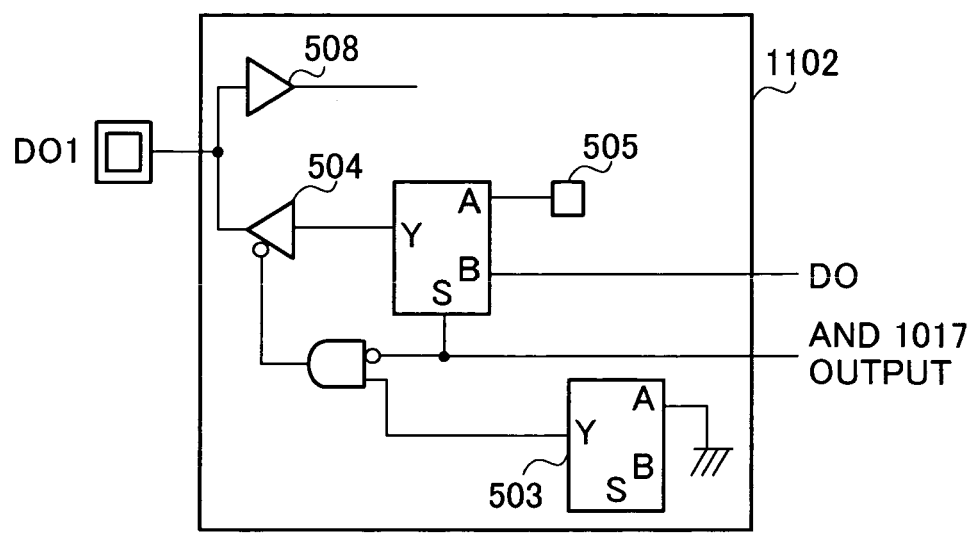
FIG. 16 is a drawing showing an exemplary configuration of an input/output circuit shown in FIG. 13 and FIG. 14.
Figure 17:
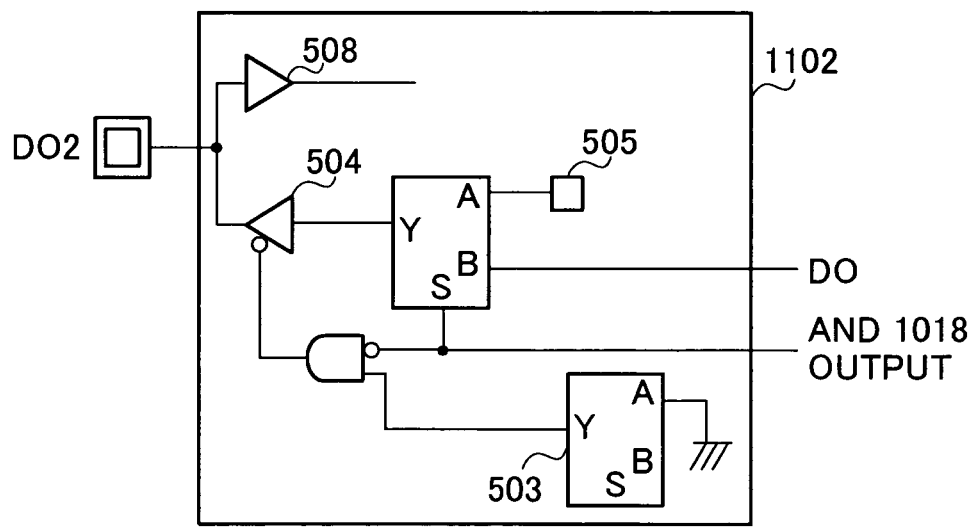
FIG. 17 is a drawing showing an exemplary configuration of an input/output circuit shown in FIG. 13 and FIG. 14.
Figure 18:
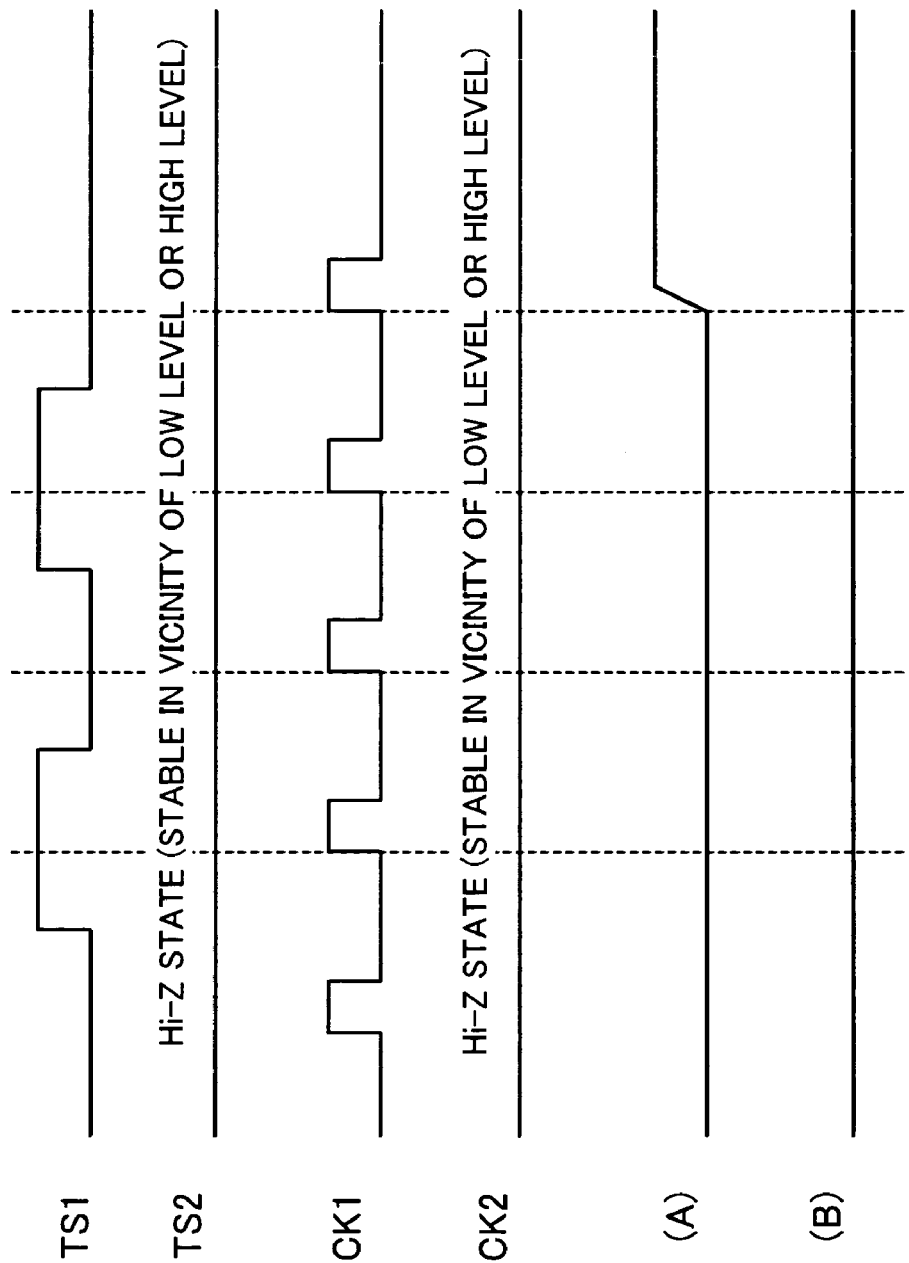
FIG. 18 is a timing chart explaining the selection operation for the two sets of dedicated leakage current test pins shown in FIG. 13 and FIG. 14.

An exemplary configuration and selection operations of input/output circuit 801 will now be described with reference to FIG. 15 through FIG. 18. FIG. 15 through FIG. 17 are drawings showing exemplary configurations of input/output circuits shown in FIG. 13 and FIG. 14. FIG. 18 is a timing chart explaining the selection operation for the two sets of dedicated leakage current test pins shown in FIG. 13 and FIG. 14.

In FIG. 15, contactless pin leakage current test cells 1001 are configured with input sides A of selectors 503 and 505 grounded, and an OR circuit inserted between selector 503 and output buffer 504, in contactless pin leakage current test cell 402 shown in FIG. 10.

Contactless pin leakage current test cells 1001 connected to the CK1 pin and TS1 pin connect the output (B) of an AND circuit 1020 to the aforementioned OR circuit. Contactless pin leakage current test cells 1001 connected to the CK2 pin and TS2 pin connect the output (A) of an AND circuit 1016 to the aforementioned OR circuit.

A contactless pin leakage current test cell 1101 connected to the TM1 pin, OC1 pin, and DI1 pin connects the output of an AND circuit 1017 to the aforementioned OR circuit. A contactless pin leakage current test cell 1101 connected to the TM2 pin, OC2 pin, and DI2 pin connects the output of an AND circuit 1018 to the aforementioned OR circuit.

Contactless pin leakage current test cells 1102 connected to the DO1 and DO2 pins shown in FIG. 16 and FIG. 17 are configured with input side A of selector 503 grounded, an AND circuit inserted between selector 503 and output buffer 504, and a selector circuit inserted between selector 505 and output buffer 504, in contactless pin leakage current test cell 402 shown in FIG. 10.

The output of selector 503 is connected to one input side of the aforementioned AND circuit, and the output of AND circuit 1017 is connected to the other input side of the aforementioned AND circuit. The output of selector 505 is connected to input side A of the aforementioned selector circuit, DO is connected to input side B of the aforementioned selector circuit, the output of AND circuit 1017 is connected to input side S of the aforementioned selector circuit, and output Y of the aforementioned selector circuit is connected to the input side of output buffer 504.

Contactless pin leakage current test cell 1102 connected to the D02 pin has the same configuration as above-described contactless pin leakage current test cell 1102 connected to the DO1 pin, but differs in that the signal connected to selector input side S and one input side of the AND circuit is the output of AND circuit 1018.

The CK1 pin of dedicated leakage current test pins (1) 803 is connected via the buffer of contactless pin leakage current test cell 1001 to one input side of an OR circuit 1002 and one input side of an AND circuit 1003. The CK2 pin of dedicated leakage current test pins (2) 902 is connected via the buffer of contactless pin leakage current test cell 1001 to one input side of an OR circuit 1004 and one input side of an AND circuit 1005.

The output side of OR circuit 1002 and the output side of OR circuit 1004 are connected to the clock sides of eight flip-flops 1007 through 1014 via an EXOR circuit 1006. A power supply reset circuit 1015 is connected to the reset sides R of flip-flops 1007 through 1014. Of the eight flip-flops 1007 through 1014, the four flip-flops 1007 through 1010 are daisy-chained and the four flip-flops 1011 through 1014 are daisy-chained.

In the case of daisy-chained flip-flops 1007 through 1010, the TS1 pin of dedicated leakage current test pins (1) 803 is connected via the contactless pin leakage current test cell 1001 buffer to data input side D of first-stage flip-flop 1007. Then the output sides of each stage are connected via AND circuit 1016 to one input side of AND circuit 1017, AND circuit 1018, and an OR circuit 1019, respectively, and are also connected to the other input side of OR circuit 1004.

In the case of daisy-chained flip-flops 1011 through 1014, the TS2 pin of dedicated leakage current test pins (2) 902 is connected via the contactless pin leakage current test cell 1001 buffer to data input side D of first-stage flip-flop 1011. Then the output sides of each stage are connected via AND circuit 1020 to the other input side of AND circuit 1017, AND circuit 1018, and an OR circuit 1019, respectively, and are also connected to the other input side of OR circuit 1002.

The output side of AND circuit 1017 is connected to the other input side of AND circuit 1003, and is also connected to one input side of an AND circuit 1021. The output side of AND circuit 1018 is connected to the other input side of AND circuit 1005, and is also connected to one input side of an AND circuit 1022. The output side of OR circuit 1019 is connected to one input side of AND circuits 1023 and 1024.

The output sides of AND circuits 1003 and 1005 are connected via an OR circuit 1025 to the other input side of AND circuit 1023. By this means, signal CK is output from the output side of AND circuit 1023 to a flip-flop in contactless pin leakage current test cell 1001.

The TM1 pin, OC1 pin, and DI1 pin of dedicated leakage current test pins (1) 803 are connected via the contactless pin leakage current test cell 1001 buffer to the other input side of AND circuit 1021. The TM2 pin, OC2 pin, and DI2 pin of dedicated leakage current test pins (2) 902 are connected via the contactless pin leakage current test cell 1001 buffer to the other input side of AND circuit 1022.

The output sides of AND circuits 1021 and 1022 are connected via an OR circuit 1026 to the other input side of AND circuit 1024. By this means, signals TM, OC, and DI are output from the output side of AND circuit 1024 to the interior of contactless pin leakage current test cell 1001.

With the above configuration, selection operations are performed for the two sets of dedicated leakage current test pins as follows. When power is started up, a power supply reset is performed by power supply reset circuit 1015, and the outputs of all of flip-flops 1007 through 1014 go to the L level. AND circuit 1016 output (A) and AND circuit 1020 output (B) go to the L level state.

Using the clock signal supplied via EXOR circuit 1006, the TS1 signal is sampled by 4-stage flip-flops 1007 through 1010, and the TS2 signal is sampled by 4-stage flip-flops 1011 through 1014.

As shown in FIG. 18, when the TS1 signal is sampled using CK1, and the output levels of 4-stage flip-flops 107 through 1010 connected to TS1 become H, L, H, L, AND circuit 1016 output (A) changes from the L level to the H level, and CK2 is cut off. That is to say, only CK1 is enabled.

Although TS2 is in the high-impedance state (Hi-Z) since it normally stabilizes in the vicinity of the L level or H level, it is highly probable that AND circuit 1020 output (B) will maintain the L level. If CK1 is fixed at the L level in this state, TS2, CK2, TM2, OC2, DI2, and DO2 become normal pins.

Next, when the TS1 signal is sampled using CK2 when AND circuit 1016 output (A) and AND circuit 1020 output (B) are in the L level state, and the output levels of 4-stage flip-flops 1011 through 1014 connected to TS2 become H, L, H, L, AND circuit 1020 output (B) changes from the L level to the H level, and the CK1 signal is cut off. That is to say, only CK2 is enabled.

Although TS1 is in the high-impedance state (Hi-Z) since it normally stabilizes in the vicinity of the L level or H level, it is highly probable that AND circuit 1016 output (A) will maintain the L level. If CK2 is fixed at the L level in this state, TS1, CK1, TM1, OC1, DI1, and DO1 become normal pins.

In the above operations, if AND circuit 1016 output (A) and AND circuit 1020 output (B) both go to the H level by mischance, CK1 and CK2 will both be cut off and leakage current test control will be impossible. Therefore, the above-mentioned flip-flops are reset by starting up power again, and the above-described operations are re-executed.

Thus, two sets of dedicated leakage current test pins are provided, and electrostatic withstand voltage testing for all pins of separate ICs can be performed using dedicated leakage current test pins (1) 803 and dedicated leakage current test pins (2) 902 respectively.

Although not shown in the drawings, it goes without saying that—as in Embodiment 2 with respect to Embodiment 1, Embodiment 4 with respect to Embodiment 3, and Embodiment 6 with respect to Embodiment 5—with respect to Embodiment 7 also, a test method can similarly be implemented in which power supply pins VDD and VDDI are connected to ground, ground pin VSS is connected to power supply apparatus 106, and leakage current test apparatus 301 is connected to ground pin VSSI.

A semiconductor integrated circuit and an electrostatic withstand voltage test method and apparatus therefor according to the present invention enable semiconductor integrated circuit electrostatic withstand voltage testing to be performed with a high degree of precision and at low cost, and are applicable to electrostatic withstand voltage testing that applies static electricity to a semiconductor integrated circuit and tests for the occurrence of electrical breakdown.

The present invention is not limited to the above-described embodiments, and various variations and modifications may be possible without departing from the scope of the present invention.

This application is based on Japanese Patent Application No.2003-272094 filed on Jul. 8, 2003, the entire content of which is expressly incorporated by reference herein.

What is claimed is:

1. A semiconductor integrated circuit electrostatic withstand voltage test method, the method comprising:

grounding a power supply pin or ground pin of a semiconductor integrated circuit to place said semiconductor integrated circuit in a first state;

applying static electricity to one or more desired pins of said semiconductor integrated circuit while in said first state;

supplying power to one of a power supply pin and ground pin of said semiconductor integrated circuit while grounding another of said power supply pin and ground pin, to place said semiconductor integrated circuit in a second state;

performing pin leakage current testing for all signal pins while in said second state;

grounding one of a power supply pin and ground pin of an internal circuit of said semiconductor integrated circuit and supplying one or more digital signals to one or more signal input pins, to place said semiconductor integrated circuit in a third state; and, performing power supply leakage current testing using one of the power supply pin and ground pin of said internal circuit while in said third state.

2. The method of claim 1, in which said step of supplying one or more digital signals to one or more signal input pins is performed with a pattern generator.

3. A semiconductor integrated circuit electrostatic withstand voltage test apparatus comprising:

a static electricity discharge section that, in a state in which a power supply pin or ground pin of a semiconductor integrated circuit is grounded, applies static electricity to one or more desired pins of said semiconductor integrated circuit;

a first leakage current testing section that, in a state in which power is supplied to one of a power supply pin and ground pin of said semiconductor integrated circuit and another is grounded, tests pin leakage current of all signal pins; and a second leakage current testing section that, in a state in which one of a power supply pin and ground pin of an internal circuit of said semiconductor integrated circuit is grounded, and one or more digital signals are supplied to one or more signal input pins, tests power supply leakage current using one of the power supply pin and ground pin of said internal circuit.

4. The apparatus of claim 3, further comprising: a pattern generator which supplies said one or more digital signals to said one or more signal input pins.

* * * * *